United States Patent
Tange et al.

(10) Patent No.: US 12,148,693 B2
(45) Date of Patent: Nov. 19, 2024

(54) SILICON TRANSFORMER INTEGRATED CHIP

(71) Applicant: Murata Manufacturing Co., Ltd., Nagaokakyo (JP)

(72) Inventors: Takayuki Tange, Milton Keynes (GB); Yoshimitsu Ushimi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 425 days.

(21) Appl. No.: 17/640,991

(22) PCT Filed: Oct. 7, 2020

(86) PCT No.: PCT/US2020/054516
§ 371 (c)(1),
(2) Date: Mar. 7, 2022

(87) PCT Pub. No.: WO2021/071901
PCT Pub. Date: Apr. 15, 2021

(65) Prior Publication Data
US 2022/0278041 A1    Sep. 1, 2022

Related U.S. Application Data

(60) Provisional application No. 62/912,245, filed on Oct. 8, 2019.

(51) Int. Cl.
*H01L 27/13* (2006.01)
*H01L 23/48* (2006.01)
(Continued)

(52) U.S. Cl.
CPC ...... *H01L 23/5227* (2013.01); *H01L 27/1207* (2013.01); *H01L 27/13* (2013.01);
(Continued)

(58) Field of Classification Search
CPC . H01L 23/5227; H01L 27/1207; H01L 27/13; H01L 28/10; H01L 23/481;
(Continued)

(56) References Cited

U.S. PATENT DOCUMENTS 8,102,236 B1 *  1/2012  Fontana, Jr. ........ H01F 17/0006
                                                    336/200
8,907,448 B2   12/2014  Chen
(Continued)

FOREIGN PATENT DOCUMENTS

| CN | 101454848 A | 6/2009 |
| CN | 106057784 A | 10/2016 |
| WO | 2016/209245 A1 | 12/2016 |

OTHER PUBLICATIONS

Official Communication issued in corresponding Chinese Patent Application No. 202080061321.6, mailed on Jun. 27, 2024.
(Continued)

*Primary Examiner* — David Vu
(74) *Attorney, Agent, or Firm* — Keating & Bennett, LLP

(57) ABSTRACT

A transformer includes a silicon substrate, a plurality of metal layers and a plurality of insulating layers laminated on the silicon substrate, a bottom winding of a metal contacting a first metal layer and a second metal layer of the plurality of metal layers, a first insulating layer on the bottom winding, a core on the first insulating layer, a second insulating layer on the core, a top winding of the metal that extends around the core and a portion of the second insulating layer, and a third insulating layer on the top winding. At least one of the top winding and the bottom winding is thicker than each of the plurality of metal layers.

25 Claims, 27 Drawing Sheets

(51) Int. Cl.
     *H01L 23/522*    (2006.01)
     *H01L 27/12*     (2006.01)
     *H01L 49/02*     (2006.01)
     *H01L 23/00*     (2006.01)
(52) U.S. Cl.
     CPC ............ *H01L 28/10* (2013.01); *H01L 23/481* (2013.01); *H01L 24/03* (2013.01)
(58) Field of Classification Search
     CPC ................ H01L 24/03; H01L 2224/11; H01L 21/76898; H01F 19/04; H01F 27/2804; H01F 27/40; H01F 41/042; H01F 41/046
     See application file for complete search history.

(56) References Cited

U.S. PATENT DOCUMENTS

| | | |
|---|---|---|
| 10,244,633 B2 | 3/2019 | Sturcken et al. |
| 2009/0072923 A1 | 3/2009 | Ishida |
| 2011/0279214 A1 | 11/2011 | Lee et al. |
| 2014/0167193 A1* | 6/2014 | Luliano ............... H10N 52/01 257/427 |
| 2016/0307991 A1 | 10/2016 | Kuo et al. |
| 2018/0097055 A1 | 4/2018 | Pizzi et al. |
| 2019/0182957 A1 | 6/2019 | Sturcken et al. |
| 2019/0221349 A1 | 7/2019 | Wolter et al. |

OTHER PUBLICATIONS

Official Communication issued in International Patent Application No. PCT/US2020/054516, mailed on Jan. 29, 2021.
Sturcken, Phd, "Integrated Power Management With Ferromagnetic Thin-Film Power Inductors", FerricSemi.com, 2018, 14 pages.
Chen, "Core and Winding Optimization of Micro-transformers for Isolated Power Conversion", Analog Devices, 2017, 15 pages.

* cited by examiner

SILICON TRANSFORMER INTEGRATED CHIP

BACKGROUND OF THE INVENTION

1. Field of the Invention

The present invention relates to transformers. More specifically, the present invention relates to a transformer integrated into a silicon substrate that can be used in DC-DC converter or power supply applications.

2. Description of the Related Art

Conventional power supplies and DC-DC converters require larger discrete magnetic components such as transformers and inductors that have inherent losses, generate heat, emit electromagnetic interference (EMI), and are costly to fabricate. Battery-operated, mobile, and handheld applications require small, efficient, and cost-effective components.

Therefore, smaller magnetic components and transformers have been developed that are fabricated directly on substrates such as printed circuit boards (PCBs) or silicon substrates. Components like planar inductors have been fabricated on a surface of silicon substrates as a semiconductor chip. These components have been made similar to integrated circuits (ICs) using semiconductor manufacturing techniques. However, as shown, for example, in WO Publication No. 2016/209245, in a power-management control IC with passive components, transformer windings in metal layers on silicon substrates are not suitable for high-current operation, such as in a DC-DC convertor application.

SUMMARY OF THE INVENTION

To overcome the problems described above, preferred embodiments of the present invention provide a transformer integrated into a silicon substrate that can be used in high-current DC-DC converter applications.

According to a preferred embodiment of the present invention, transformers are fabricated using plated metal layers on a silicon substrate. Transformers including a core are made by a plating process that is different from conventional silicon processes in which the transformer components are covered by an insulation material such as polyimide. Furthermore, circuitry on the primary side and circuitry on the secondary side of the transformer can coexist on the silicon substrate and can be electrically isolated from each other by a PN junction, which allows the distance between the primary circuitry and the secondary circuitry to be minimized.

According to a preferred embodiment of the present invention, a transformer includes a silicon substrate, a plurality of metal layers and a plurality of insulating layers laminated on the silicon substrate, a first bottom winding of a metal contacting a first metal layer of the plurality of metal layers and a second bottom winding of copper contacting a second metal layer of the plurality of metal layers, a first insulating layer on the first and the second bottom windings, a core on the first insulating layer, a second insulating layer on the core, first and second top windings of the metal that extend around the core and a portion of the second insulating layer, and a third insulating layer on the first and second top windings. At least one of a group including the first top winding, the second top winding, the first bottom winding, and the second bottom winding is thicker than each of the plurality of metal layers.

The transformer can further include circuitry on the silicon substrate, where the first bottom winding, the second bottom winding, the first top winding, the second bottom winding, and the core can be on a same side of the silicon substrate as the circuitry. The transformer can further include a PN junction in the silicon substrate that isolates a primary side and a secondary side of the transformer. The first bottom winding, the second bottom winding, the first top winding, and the second top winding can include an electroplated copper layer. The first top winding and the first bottom winding can define a primary winding and the second top winding and the second bottom winding define a secondary winding, and the primary winding and the secondary winding can be connected to respective metal layers of the plurality of metal layers and can be not electrically connected to each other.

According to a preferred embodiment of the present invention, a method of manufacturing a transformer includes providing a silicon substrate; laminating a plurality of metal layers and a plurality of insulating layers on the silicon substrate; electroplating copper to form a first bottom winding that contacts a first metal layer of the plurality of metal layers and a second bottom winding that contacts a second metal layer of the plurality of metal layers; forming a first insulating layer on the bottom winding; electroplating a core on the first insulating layer; forming a second insulating layer on the core; electroplating copper to form first and second top windings on the second insulating layer, the first and second top windings extend around the core; and forming a third insulating layer on the first and second top windings.

At least one of a group including the first top winding, the second top winding, the first bottom winding, and the second bottom winding can be thicker than each of the plurality of metal layers. The first top winding and the first bottom winding can define a primary winding; the second top winding and the second bottom winding define a secondary winding, and the primary winding and the secondary winding can be connected to respective metal layers of the plurality of metal layers and can be not electrically connected to each other.

According to a preferred embodiment of the present invention, a transformer includes a first silicon substrate; circuitry that is located on a first side of the first silicon substrate and that includes a plurality of metal layers; an oxide layer on a second side of the first silicon substrate; a second silicon substrate on the oxide layer; a bottom winding of a metal that is located on the second silicon substrate and that is connected to the circuitry through the second silicon substrate, the oxide layer, and the first silicon substrate; a first insulating layer on the bottom winding; a core on the first insulating layer; a second insulating layer on the core; a top winding of the metal that extends around the core and a portion of the second insulating layer, and that is connected to the circuitry through the second silicon substrate, the oxide layer, and the first silicon substrate; and a third insulating layer on the top winding. At least one of the top winding and the bottom winding is thicker than each of the plurality of metal layers.

The transformer can further include a PN junction in the first silicon substrate and the second silicon substrate that isolates a primary side and a secondary side of the transformer. The bottom winding and the top winding can include an electroplated copper layer. The top winding and the bottom winding can define a primary winding and a secondary winding, and the primary winding and the secondary winding can be connected to respective metal layers of the plurality of metal layers and can be not electrically connected to each other.

According to a preferred embodiment of the present invention, a method of manufacturing a transformer includes providing a first silicon substrate; forming circuitry on a first side of the first silicon substrate; forming an oxide layer on a second side of the first silicon substrate; providing a second silicon substrate on the oxide layer; forming through holes in the second silicon substrate, the oxide layer, and the first silicone substrate; filling the through holes with a conductive metal that directly contacts the circuitry; depositing a metal on the second silicon substrate to form a bottom winding that contacts the conductive metal; forming a first insulating layer on the bottom winding; electroplating a core on the first insulating layer; forming a second insulating layer on the core; depositing the metal to form a top winding on the second insulating layer and around the core that contacts the conductive metal; and forming a third insulating layer on the top winding.

The step of forming circuitry can include forming a plurality of metal layers, and at least one of the top winding and the bottom winding can be thicker than each of the plurality of metal layers. The top winding and the bottom winding can define a primary winding and a secondary winding, and the primary winding and the secondary winding can be connected to respective metal layers of the plurality of metal layers and can be not electrically connected to each other. The metal can be electro-plated copper.

According to a preferred embodiment of the present invention, a transformer includes a silicon substrate; circuitry that is located on a first side of the silicon substrate and that includes a plurality of metal layers; a bottom winding of a metal located on a second side of the silicon substrate and contacting the circuitry through the silicon substrate; a first insulating layer on the bottom winding; a core on the first insulating layer; a second insulating layer on the core; a top winding of the metal around the core and a portion of the second insulating layer, and contacting the circuitry through the silicon substrate; and a third insulating layer on the top winding. At least one of the top winding and the bottom winding is thicker than each of the plurality of metal layers.

The transformer can further include a PN junction in the silicon substrate isolating a primary side from a secondary side of the transformer. The bottom winding and the top winding can include an electroplated copper layer. The top winding and the bottom winding can define a primary winding and a secondary winding, and the primary winding and the secondary winding can be connected to respective metal layers of the plurality of metal layers and can be not electrically connected to each other.

According to a preferred embodiment of the present invention, a method of manufacturing a transformer includes providing a silicon substrate, forming circuitry on a first side of the silicon substrate, forming through holes in the silicon substrate, filling the through holes with a conductive metal that directly contacts a metal layer of the circuitry, depositing a metal on a second side of the silicon substrate to form a bottom winding that contacts the conductive metal, forming a first insulating layer on the bottom winding, electroplating a core on the first insulating layer, forming a second insulating layer on the core, depositing the metal to form a top winding on the second insulating layer and around the core that contacts the conductive metal, and forming a third insulating layer on the top winding.

At least one of the top winding and the bottom winding can be thicker than any metal layer formed on the silicon substrate. The top winding and the bottom winding can define a primary winding and a secondary winding, and the primary winding and the secondary winding can be not electrically connected to each other.

According to a preferred embodiment of the present invention, an electronic component includes a redistribution layer including a metal layer and an insulating layer, a silicon substrate including a first transistor and a second transistor, and a magnetic component that includes a first metal winding that extends around a core and that is connected to the metal layer. The first metal winding is thicker than the metal layer.

The electronic component can further include a PN junction between the first transistor and the second transistor. The electronic component can further include a through-silicon via that extends through at least a portion of the silicon substrate and that connects the metal layer and the first metal winding. A portion of the first metal winding can be in direct contact with the silicon substrate. The redistribution layer and the magnetic component can be on opposite sides of the silicon substrate or can be on a same side of the silicon substrate. The magnetic component can be a transformer and can further include a second metal winding, and the second metal winding can extend around the core and can be not electrically connected to the first metal winding. The first transistor can be connected to the first metal winding, and the second transistor can be connected to the second metal winding. The first metal winding and the second metal winding can be electrically isolated from each other. The magnetic component can be an inductor. The second metal winding can be thicker than the metal layer. The second metal winding can include an electroplated copper layer. The first metal winding can include an electroplated copper layer.

According to a preferred embodiment of the present invention, a transformer includes a silicon substrate and an insulating layer that is on the silicon substrate and that includes a plurality of metal layers, a core, a bottom winding of a metal that extends below the core and that contacts a first metal layer and a second metal layer of the plurality of metal layers, and a top winding of the metal that extends around the core. At least one of the top winding and the bottom winding is thicker than each of the plurality of metal layers.

The transformer can further include circuitry on the silicon substrate, where the bottom winding, the top winding, and the core can be on a same side of the silicon substrate as the circuitry. The transformer can further include a PN junction in the silicon substrate that isolates a primary side and a secondary side of the transformer. The bottom winding and the top winding can include an electroplated copper layer. The top winding and the bottom winding can define a primary winding and a secondary winding, and the primary winding and the secondary winding can be connected to respective metal layers of the plurality of metal layers and can be not electrically connected to each other. The metal can be copper.

According to a preferred embodiment of the present invention, a transformer includes a silicon substrate including an oxide layer; circuitry that is located on a first side of the silicon substrate and that includes a plurality of metal layers; and an insulating layer that is located on a second side of the silicon substrate and that includes a core, a bottom winding of a metal that extends below the core that is connected to the circuitry through the silicon substrate and the oxide layer, and a top winding of the metal that extends around the core and that is connected to the circuitry through the silicon substrate and the oxide layer. At least one of the top winding and the bottom winding is thicker than each of the plurality of metal layers.

The transformer can further include a PN junction in the first silicon substrate and the second silicon substrate that isolates a primary side and a secondary side of the transformer. The bottom winding and the top winding can include an electroplated copper layer. The top winding and the bottom winding can define a primary winding and a secondary winding, and the primary winding and the secondary winding can be connected to respective metal layers of the plurality of metal layers and can be not electrically connected to each other.

According to a preferred embodiment of the present invention, a transformer includes a silicon substrate; circuitry that is located on a first side of the silicon substrate and that includes a plurality of metal layers; and an insulating layer that is located on a second side of the silicon substrate and that includes a core, a bottom winding of a metal that extends below the core and that contacts the circuitry through the silicon substrate, and a top winding of the metal that extends around the core and that contacts the circuitry through the silicon substrate. At least one of the top winding and the bottom winding is thicker than each of the plurality of metal layers.

The transformer can further include a PN junction in the silicon substrate isolating a primary side from a secondary side of the transformer. The bottom winding and the top winding can include an electroplated copper layer. The top winding and the bottom winding can define a primary winding and a secondary winding, and the primary winding and the secondary winding can be connected to respective metal layers of the plurality of metal layers and can be not electrically connected to each other.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

A transformer integrated into a silicon substrate allows the thickness of the metal of the windings to be increased.

Therefore, the transformer can transmit increased current, while maintaining a small physical size. Thus, the transformer can be used in smaller-volume, higher-power applications.

Figure 1:
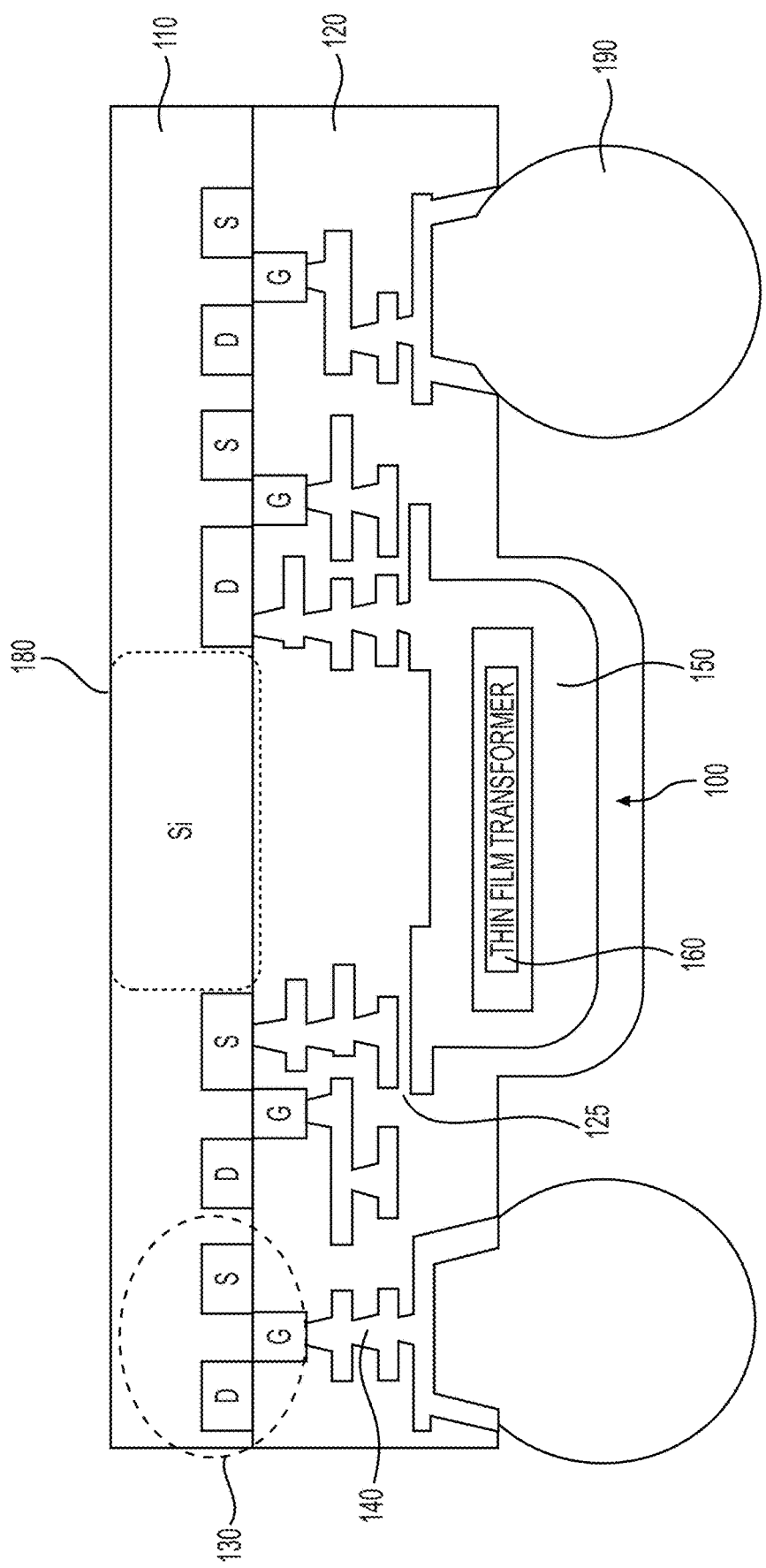
FIG. 1 shows a transformer in a circuit according to a preferred embodiment of the present invention.

FIG. 1 shows a transformer 100 in a circuit on a silicon substrate 110 according to a preferred embodiment of the present invention. FIG. 1 is a cross section of a portion of a circuit. FIG. 1 shows that the silicon substrate 110 can include doped areas defining sources S and drains D and a metal layer defining gates G of transistors 130 (within, for example, the dashed oval). The transistors can be interconnected by metal layers 140 within an insulating material 120 on the silicon substrate 110. The metal layers 140 can be formed using typical semiconductor processing techniques. The transformer 100 includes plated-copper metal windings 150 that wrap around a core 160. The metal windings 150 are connected to the metal layers 140. The metal windings 150 can include primary and secondary windings that are not physically connected to each other. For example, the primary windings can be connected to the metal layers 140 on a first side of the transformer 100 and can be not connected on a second side of transformer 100 with an insulating material between the primary winding and the metal layers 140, and the secondary windings can be connected to the metal layers 140 on the second side of the transformer 100 and can be not connected on the first side of transformer 100 with an insulating material between the secondary winding and the metal layers 140. Thus, the primary winding and the second winding are not physically connected to each other. As shown in FIG. 1, the primary and secondary windings can be not connected to the metal layers 140 in certain regions between metal layers 140 such as at an isolated point 125.

The metal windings 150 are thicker than the metal layers 140, which allows the metal windings 150 to transmit higher current. For example, the thickness of the metal windings 150 can be about 40 µm to about 60 µm, within manufacturing tolerances, and each metal layer can be up to about 3 µm, within manufacturing tolerances. The core 160 can be made of a cobalt alloy such as CoNiFe, CoFeSi, CoZrO, CoZrTa, made of a soft alloy such as Ni, Fe, NiFe, or can be made of any suitable magnetic material.

Although FIG. 1 shows a single cross section of the transformer 100, it should be understood that the metal windings 150 includes both a primary winding connected to the primary circuit and a secondary winding that is connected to the secondary circuit. The primary and the secondary windings are not connected to each other to provide isolation between the primary and the secondary sides of the transformer 100. Instead of transformer 100, it is possible to use an inductor, in which the metal windings 150 is a single winding.

FIG. 1 shows that a PN junction 180 (within the dotted box) in the silicon substrate 110 is used to isolate the circuitry between the primary side and the secondary side of the transformer 100. For example, power transistors on the primary side can be defined by the transistors on the left side of FIG. 1, and synchronous rectifiers on the secondary side can be defined by the transistors on the right side of FIG. 1. As shown, solder balls 190 can be used to interconnect the integrated circuitry to power, control signals, external circuitry, etc., although other interface features and techniques are also possible.

FIGS. 2-25 show successive processing steps that can be used in fabricating the transformer 100 shown in FIG. 1. A description of features previously described with respect to FIG. 1 may be omitted for brevity.

Figure 2:
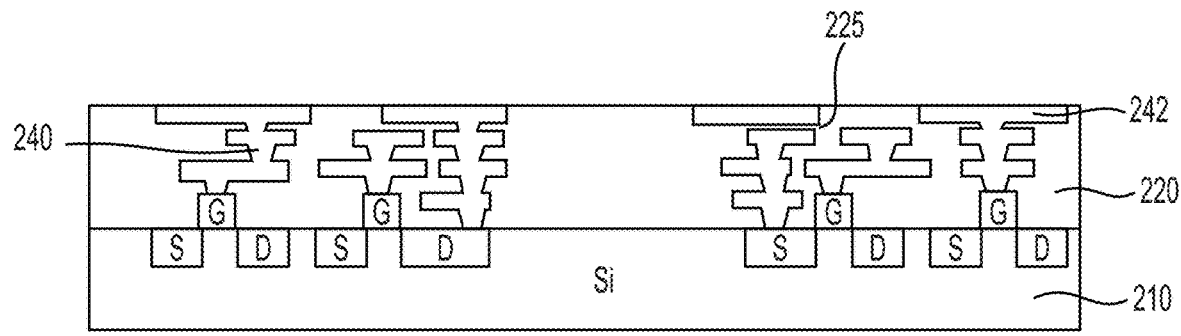
FIGS. 2-25 show processing steps included in fabricating the transformer shown in FIG. 1.
Figure 3:
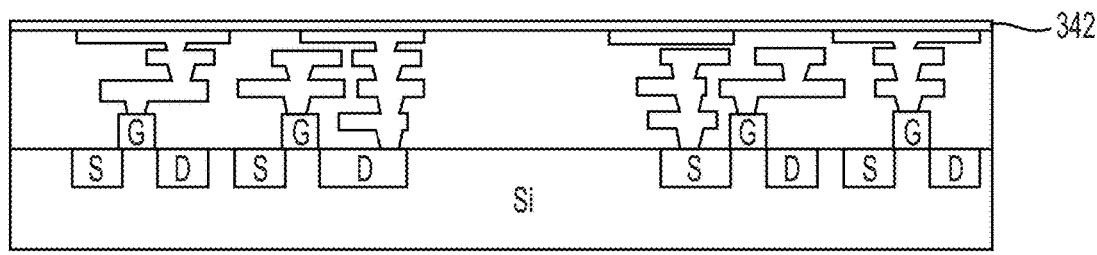
Figure 4:
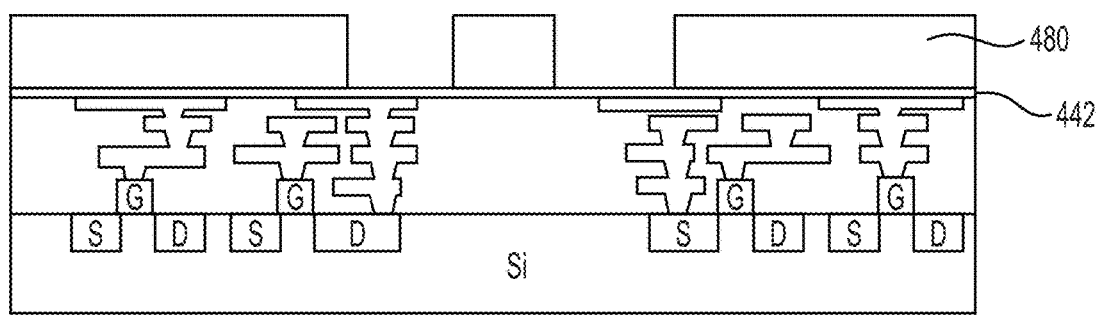

FIG. 2 shows circuitry including multiple insulating layers 220 laminated together (shown as one bulk material because each of the multiple insulating layers 220 may be indistinguishable from each other after lamination) and metal layers 240 including a redistribution layer (RDL) 242 that are formed on a silicon substrate 210 using conventional semiconductor processing techniques. FIG. 2 also shows that an isolated point 225 of insulating material is formed in a portion between the metal layers 240 and the RDL 242. FIG. 3 shows a first seed metal 342 formed on the RDL. For example, the seed metal can be Ni, Cr, Au, Cu, or any other suitable material that can be deposited or electroplated on top of the RDL. FIG. 4 shows a patterned resist film 480 that covers a portion of the first seed metal 442 and that exposes a portion of the first seed metal 442.

Figure 5:
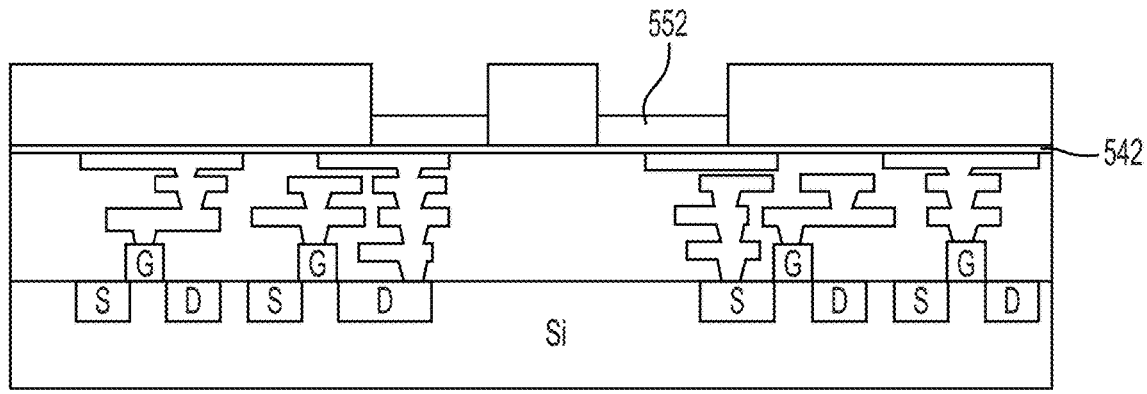
Figure 6:
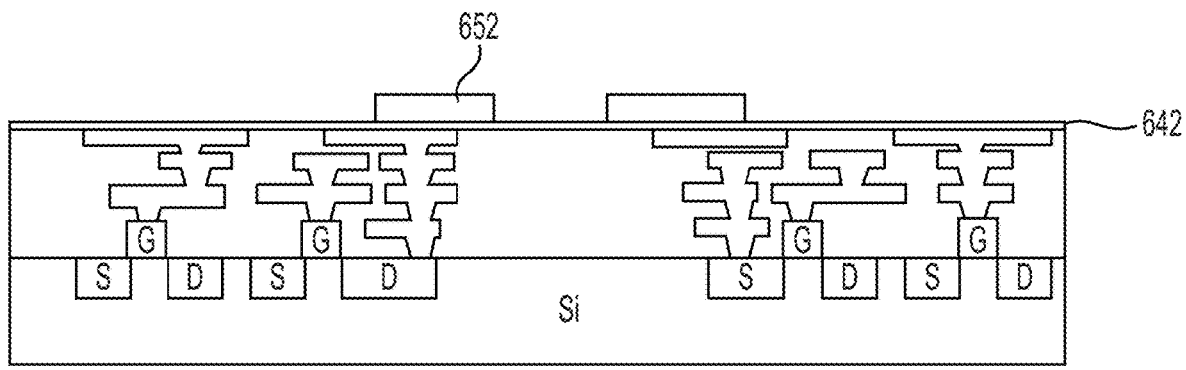
Figure 7:
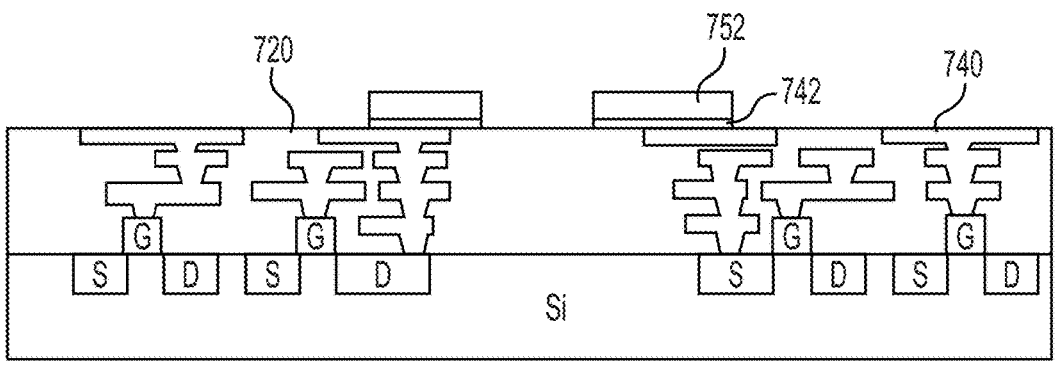

FIG. 5 shows that a bottom winding layer 552 of the transformer is formed by electrolytically plating copper onto the exposed portion of the first seed metal 542. Although FIG. 5 shows a single cross section, it should be understood that multiple, electrically isolated bottom winding layers are formed. The bottom winding layers can be formed in a single step or multiple steps. In a transformer, some of the bottom winding layers define a portion of the primary winding, and some of the bottom winding layers define a portion of the secondary winding. In an inductor, the bottom winding layers define a portion of the inductor winding. In the step shown by FIG. 6, the resist film is stripped, exposing the first seed metal 642 and the bottom winding layer 652. FIG. 7 shows that the first seed metal 742 that is not covered by the bottom winding layer 752 is etched away. The portion of the winding of the transformer or inductor that is defined by the bottom winding layer 752 and the remaining portion of the first seed metal 742 are in direct contact with the top metal layer 740 and the top insulating layer 720.

Figure 8:
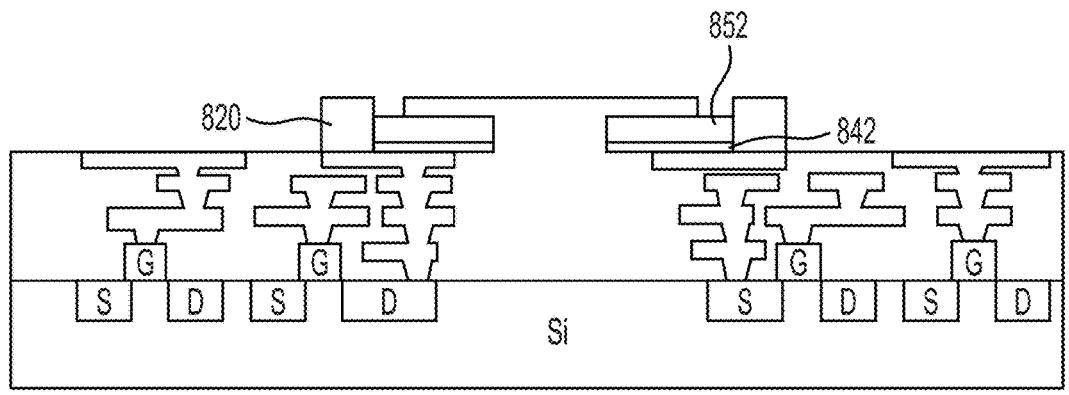
Figure 9:
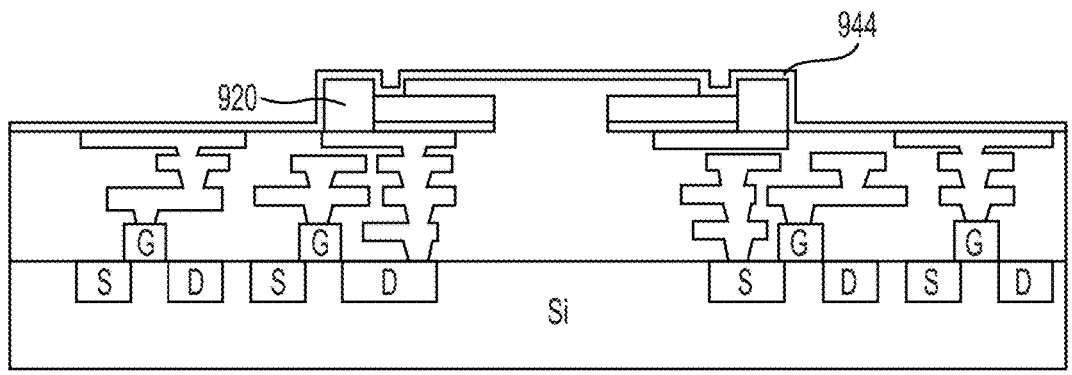
Figure 10:
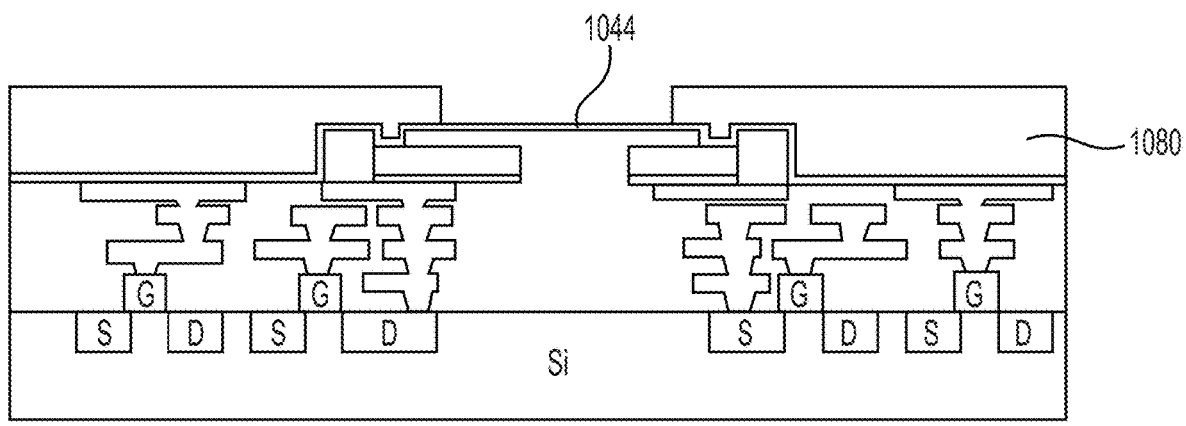
Figure 68:
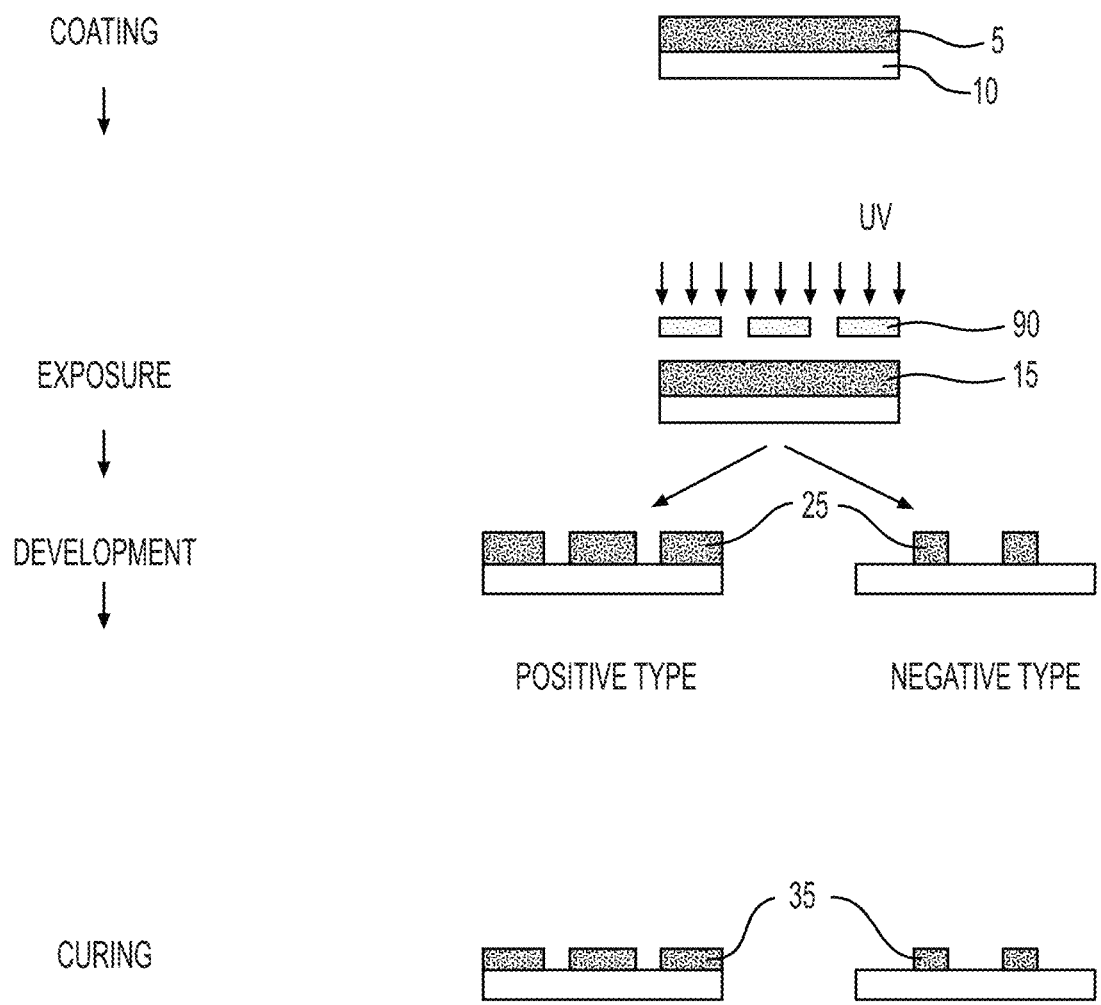
FIG. 68 shows a process for fabricating a photosensitive polyimide as an insulating layer.

FIG. 8 shows that an insulating layer 820 is formed on and around the patterned first seed metal 842 and the bottom winding layer 852. FIG. 68 shows a process for fabricating a photosensitive polyimide (PSPI) as an insulating layer. FIG. 68 shows that an insulating layer is formed by (1) coating an uncured positive or negative type PSPI 5 on a substrate 10, (2) patterning the coated uncured PSPI 15 with ultraviolet (UV) radiation through a mask 90, (3) developing the radiated, coated, uncured PSPI 25, resulting in a patterned positive or negative image of the mask 90, and (4) curing the patterned PSPI 35 by heat treatment. The insulating layer 820 in FIG. 8 can be a polyimide, Su-9, Novolak resist, or any other suitable material. FIG. 9 shows that a second seed metal 944 is formed on top of the insulating layer 920. FIG. 10 shows that a patterned resist film 1080 is formed on top of the second seed metal 1044, exposing a portion of the second seed metal 1044.

Figure 11:
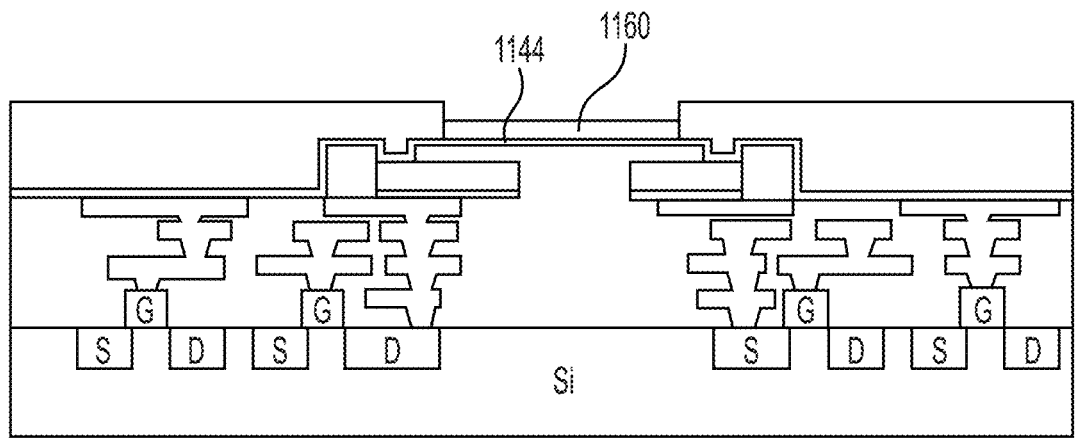
Figure 12:
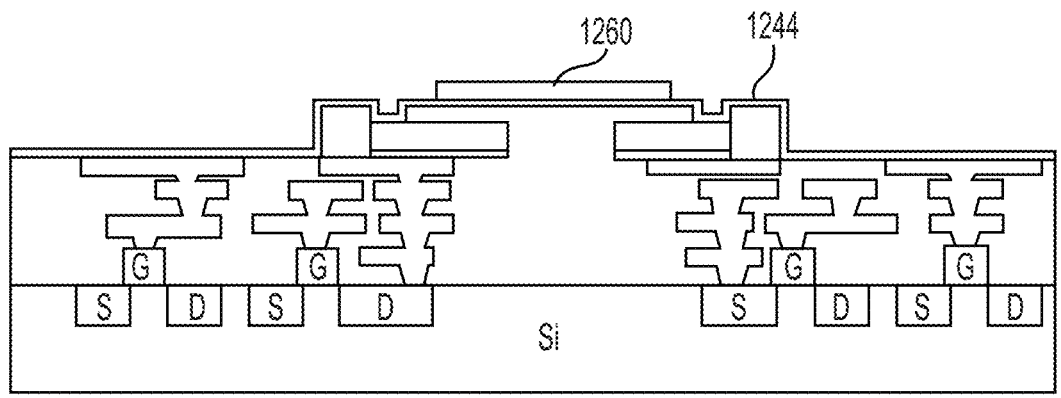
Figure 13:
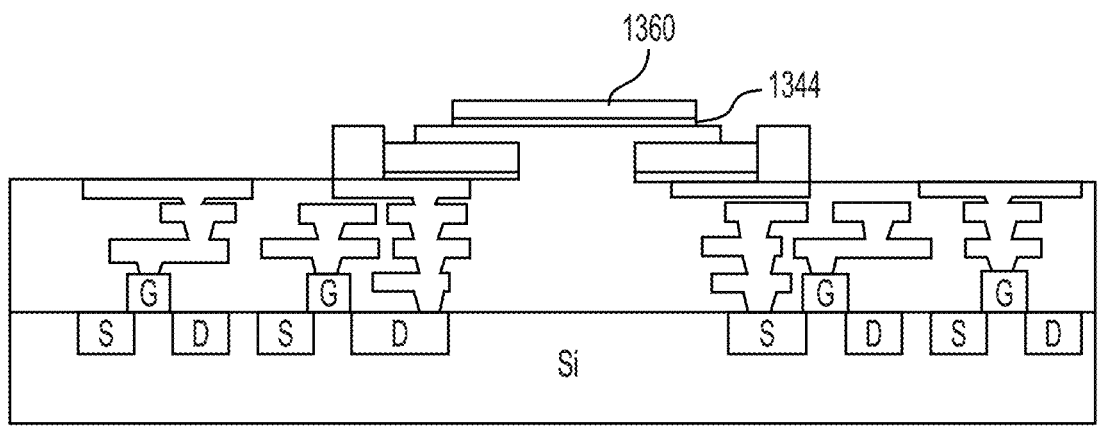

FIG. 11 shows that a magnetic core 1160 is formed by electroplating any of the materials previously described on the exposed portion of the second seed metal 1144. In the step shown by FIG. 12, the resist film is stripped, exposing the magnetic core 1260 and the second seed metal 1244. FIG. 13 shows that the second seed metal 1344 that is not covered by the magnetic core 1360 is etched away.

Figure 14:
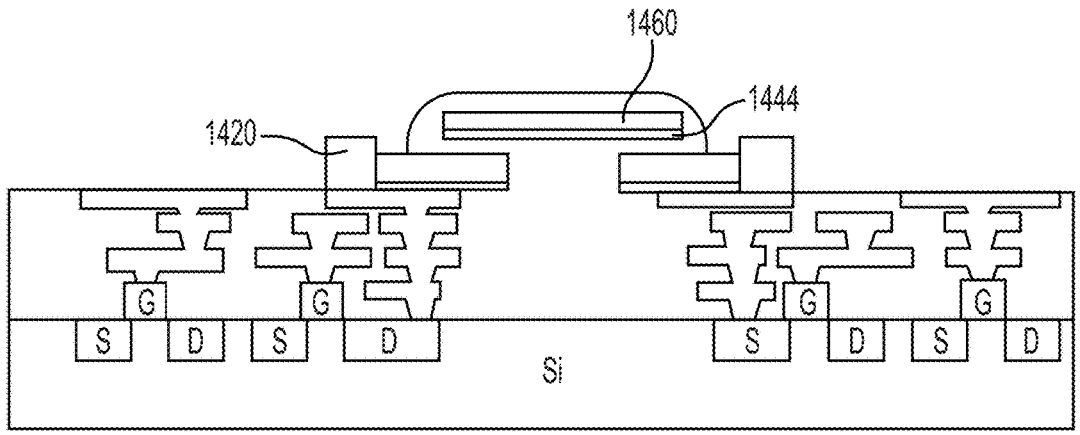
Figure 15:
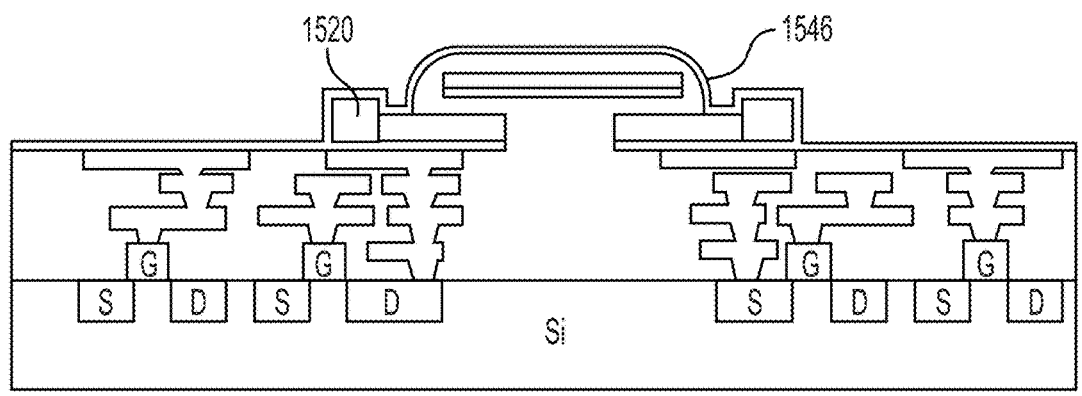
Figure 16:
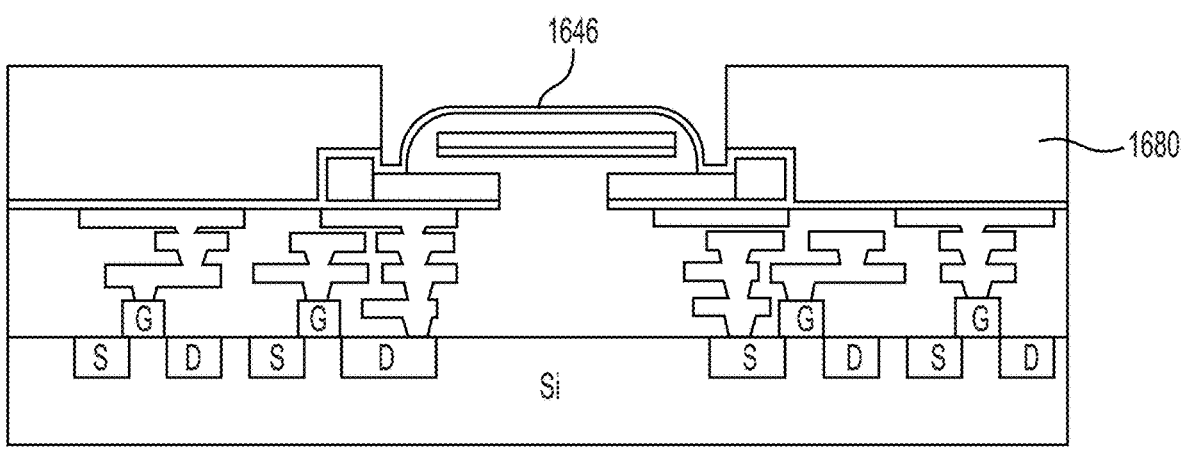

FIG. 14 shows that an insulating layer 1420 is formed on and around the patterned second seed metal 1444 and the magnetic core 1460 using the process previously described with respect to FIG. 68. FIG. 15 shows that a third seed metal 1546 is formed on top of the insulating layer 1520. FIG. 16 shows that a patterned resist film 1680 is formed on top of the third seed metal 1646, exposing a portion of the third seed metal 1646.

Figure 17:
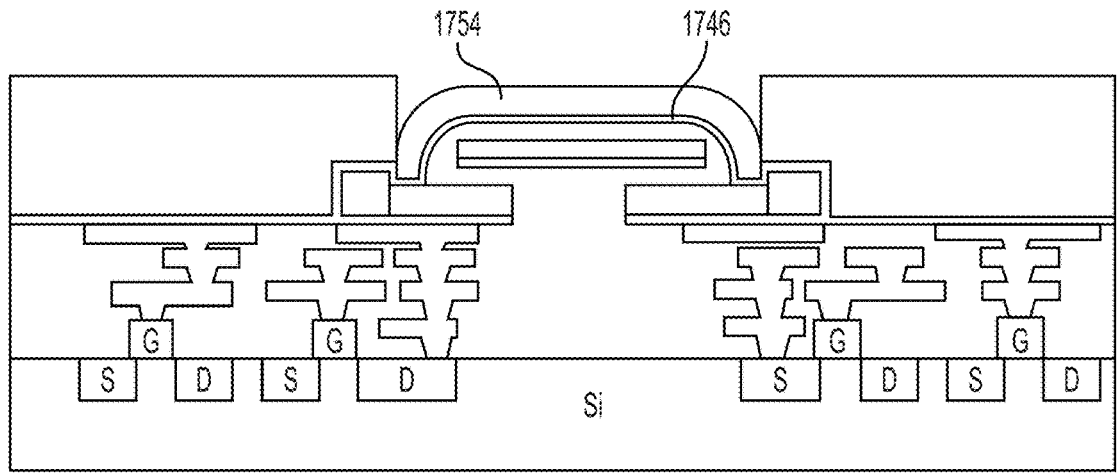
Figure 18:
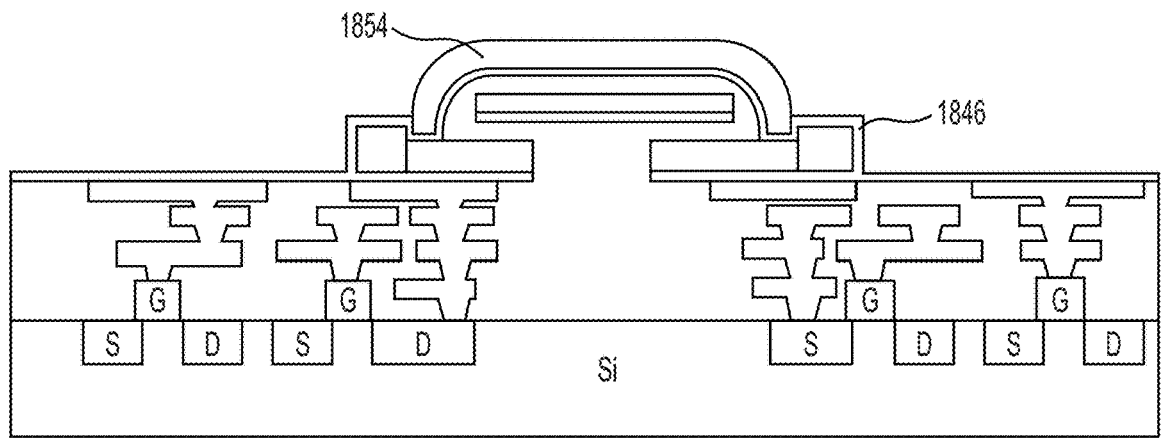
Figure 19:
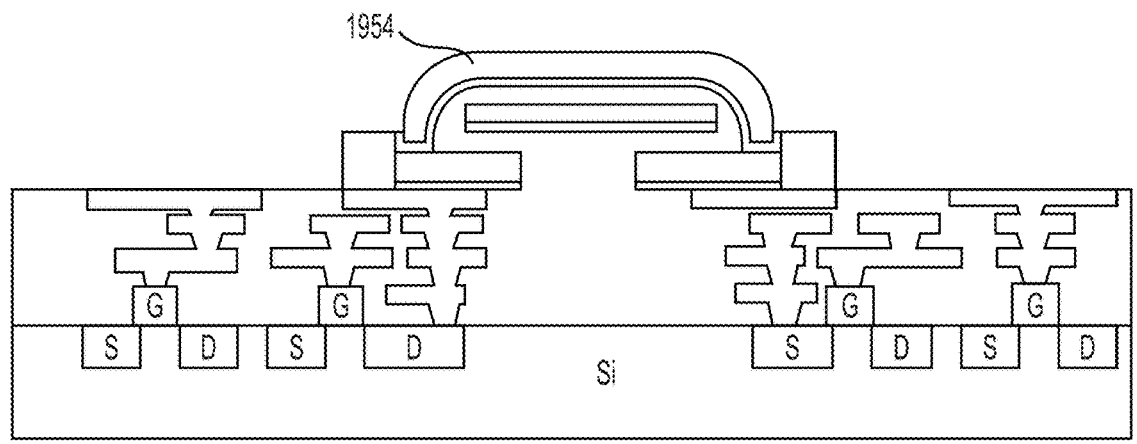

FIG. 17 shows that a top winding layer 1754 is formed by electrolytically plating copper onto the exposed portion of the third seed metal 1746. Although FIG. 17 shows a single cross section, it should be understood that the top winding layer 1754 is connected to different bottom winding layers. Multiple top winding layers can be formed in a single step or in multiple steps. In a transformer, some of the top winding layers define a portion of the primary winding, and some of the top winding layers define a portion of the secondary winding. In an inductor, the top winding layers define a portion of the inductor winding. In the step shown by FIG. 18, the resist film is stripped, exposing the third seed metal 1846 and the top winding layer 1854. FIG. 19 shows that the third seed metal not covered by the top winding layer 1954 is etched away.

Figure 20:
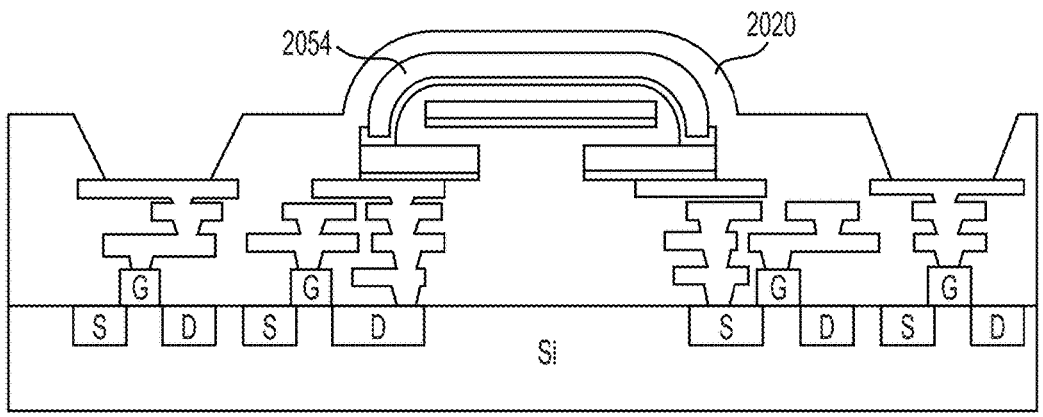
Figure 21:
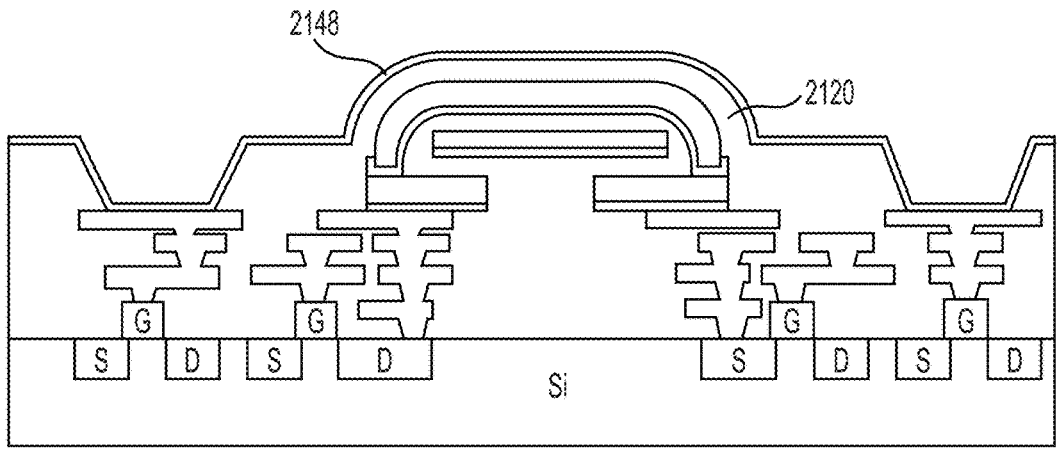
Figure 22:
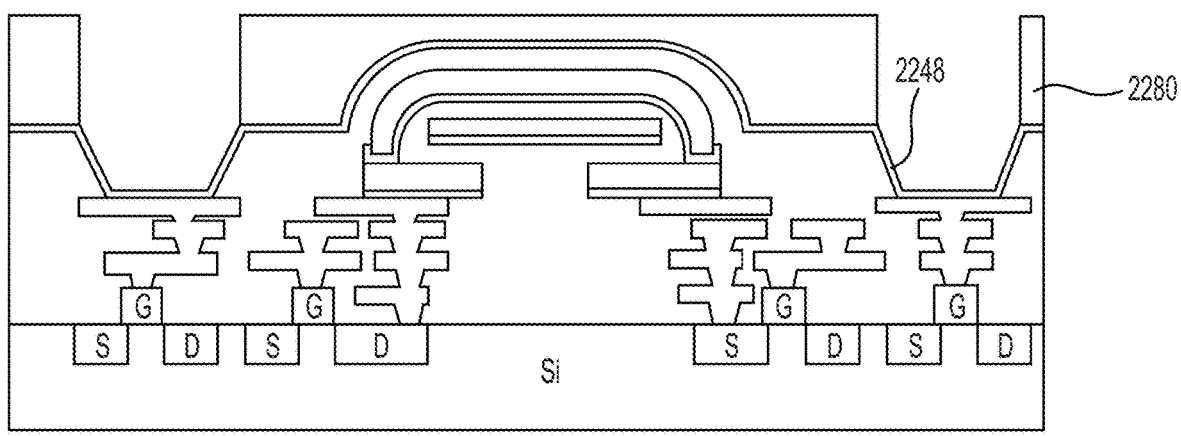

FIG. 20 shows that an insulating layer 2020 is formed on and around the top winding layer 2054 using the process described with respect to FIG. 68. In addition to covering the top winding layer 2054, the insulating layer 2020 can include wells in which interconnection pads can be formed. FIG. 21 shows that a fourth seed metal 2148 is formed on top of the insulating layer 2120. FIG. 22 shows that a patterned resist film 2280 is formed on top of the fourth seed metal 2248, exposing portions of the fourth seed metal 2248 in the areas where the interconnections pads will be provided.

Figure 23:
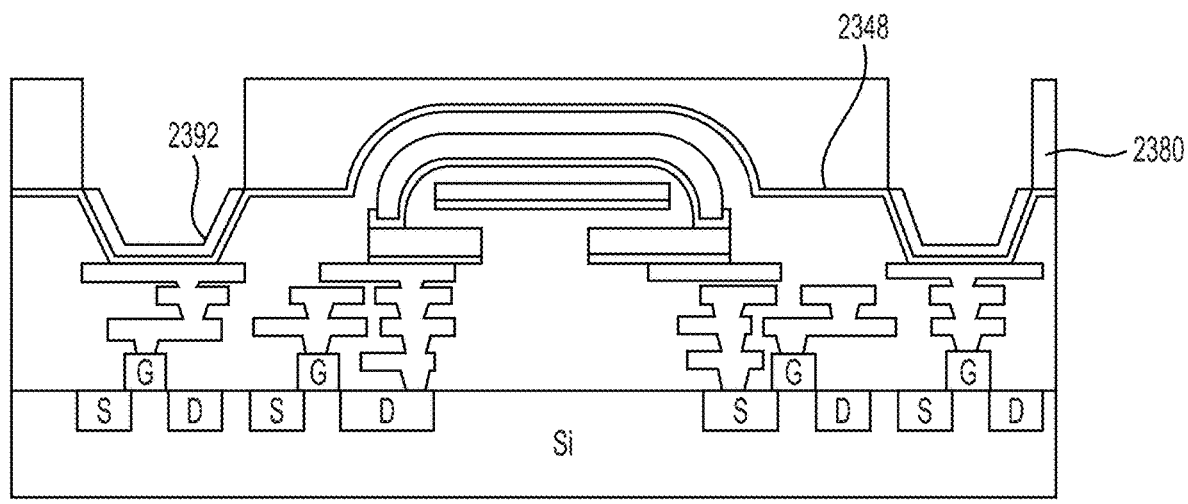
Figure 24:
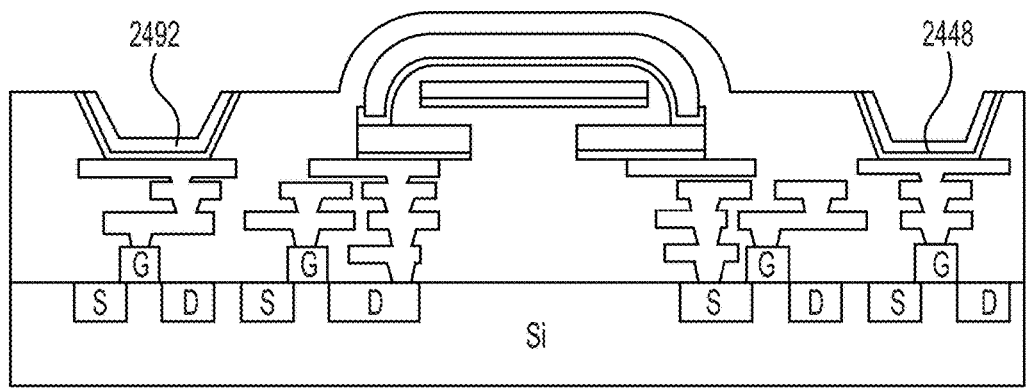
Figure 25:
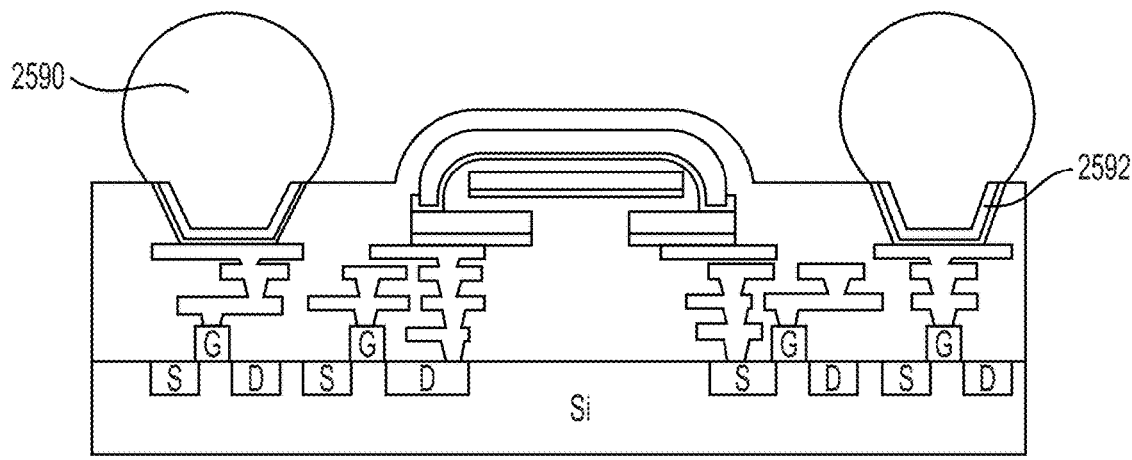

FIG. 23 shows that an interconnection pad 2392 is formed by electroplating copper on the portions of the fourth seed metal 2348 that are exposed by the resist film 2380. Although FIG. 23 shows only two interconnects pads 2392 are formed, any number of interconnection pads can be formed. In the step shown by FIG. 24, the resist film is stripped, and the fourth seed metal 2448 not covered by the interconnection pad 2492 is etched away. FIG. 25 shows that solder balls 2590 can be formed on the interconnection pads 2592.

Figure 26:
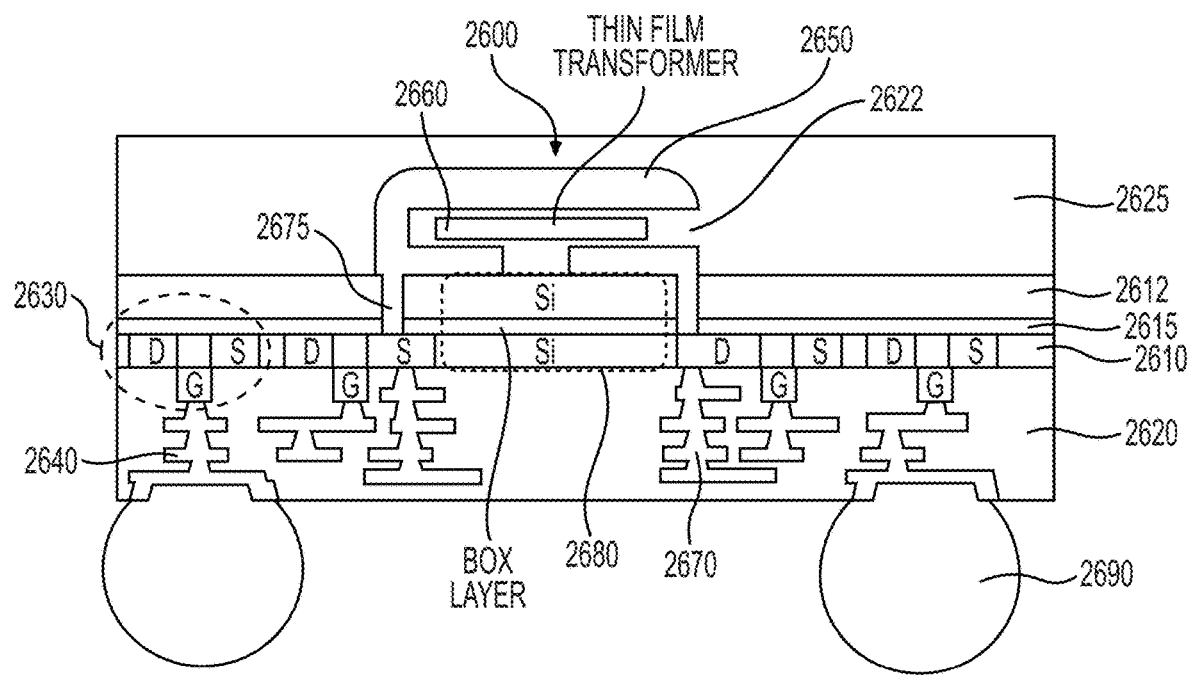
FIG. 26 shows a transformer in a circuit according to another preferred embodiment of the present invention.

FIG. 26 shows a transformer 2600 in a circuit on a silicon substrate according to another preferred embodiment of the present invention. FIG. 26 is a cross section of a portion of a circuit. In this embodiment, the substrate includes a first silicon substrate 2610, a second silicon substrate 2612, and a buried oxide (BOX) layer 2615 between the first and the second silicon substrates 2610, 2612. Similar to the preferred embodiment shown in FIG. 1, FIG. 26 shows that the first silicon substrate 2610 can include doped areas defining sources S and drains D and a metal layer defining gates G of transistors 2630 (within, for example, the dashed oval). The transistors 2630 can be interconnected by laminating metal layers 2640 with insulating layers 2620 on the first silicon substrate 2610. The metal layers 2640 are formed using typical semiconductor processing techniques. The transformer 2600 includes plated-copper metal windings 2650 that wrap around a core 2660. The metal windings 2650 are connected to the circuit with metal layers 2670. The metal windings 2650 are thicker than the metal layers 2640, with thicknesses as previously described, which allows the metal windings 2650 to transmit higher current. The core 2660 can include any of the materials previously described.

Although FIG. 26 shows a single cross section of the transformer 2600, it should be understood that the metal windings 2650 include both a primary winding connected to the primary circuit and a secondary winding that is connected to the secondary circuit, where the primary winding and the secondary winding are not physically connected to each other which provides isolation between the primary and the secondary sides of the transformer 2600. Additionally, portions of the metal windings 2650 can be not connected to the metal layers 2640 where adjacent metal layers 2640 are separated by an isolated point 2622 that is made of insulating material, which provides isolation between the adjacent metal layers 2640. The cross-section shown in FIG. 26 shows a portion of the metal winding 2650 connected to the primary side of the transformer (i.e., the left side of FIG. 26) and a portion of the metal windings 2650 connected to the secondary side of the transformer (i.e., the right side of FIG. 26). Instead of transformer 2600, it is possible to use an inductor, in which the metal windings 2650 is a single winding.

FIG. 26 shows that a PN junction 2680 (within dotted box) in the first silicon substrate 2610 is used to isolate the circuitry between the primary side and the secondary side of the transformer 2600. For example, power transistors on the primary side can be defined by the transistors on the left side of FIG. 26, and synchronous rectifiers on the secondary side can be defined by the transistors on the right side of FIG. 26. As shown, solder balls 2690 can be used to interconnect the integrated circuitry to power, control signals, external circuitry, etc., although other interface features and techniques are also possible.

In this preferred embodiment, the transformer 2600 is formed on the opposite side of the first and the second silicon substrates 2610, 2612 from the circuitry and connected to the circuitry by through silicon vias (TSV) 2675 and covered by an insulating layer 2625. Although only two TSVs 2675 are shown in FIG. 26, any number of TSVs 2675 can be used. Typically, each winding of the transformer or inductor will include two TSVs. But additional TSVs could be used, if, for example, the winding includes a center tap. As mentioned, the first and the second silicon substrates 2610, 2012 can include a BOX layer 2615 between them, which can assist in manufacturing the TSVs 2675. The BOX layer 2615 can assist in creating TSVs 2675, as shown in FIG. 26, that do not extend all the way through the first silicon substrate 2610. If TSVs are used that extend all the way through the first silicon substrate 2610, then it is possible to not to use a BOX layer.

The silicon on BOX layer structure reduces parasitic capacitance created in the circuit and is suitable with higher operating frequencies and improved performance. Additionally, the current path through the TSVs 2675 from the active silicon layer to the transformer is relatively short compared with configurations with a thicker silicon substrate, which helps increase circuit efficiency. The shorter TSVs 2675 provides greater design layout flexibility and smaller circuit layouts. Therefore, this configuration has better efficiency, is smaller, and can be operated at a higher frequency compared to a similar structure without the BOX layer.

FIGS. 27-46 show successive processing steps included in fabricating the transformer 2600 shown in FIG. 26. A description of features previously described may be omitted for brevity.

Figure 27:
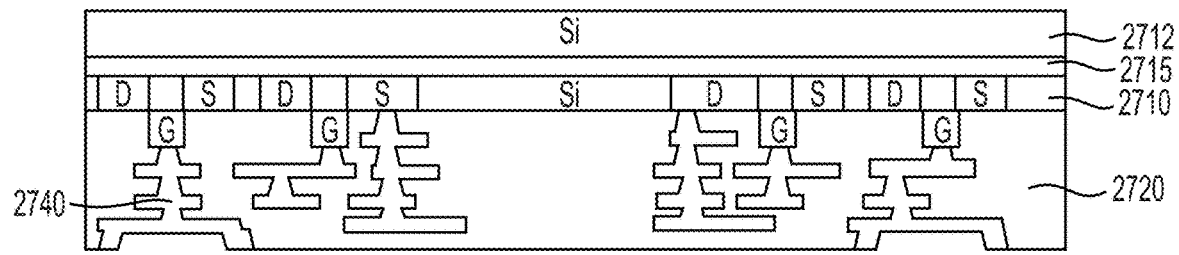
FIGS. 27-46 show processing steps included in fabricating the transformer shown in FIG. 26 according to a preferred process of the present invention.
Figure 28:
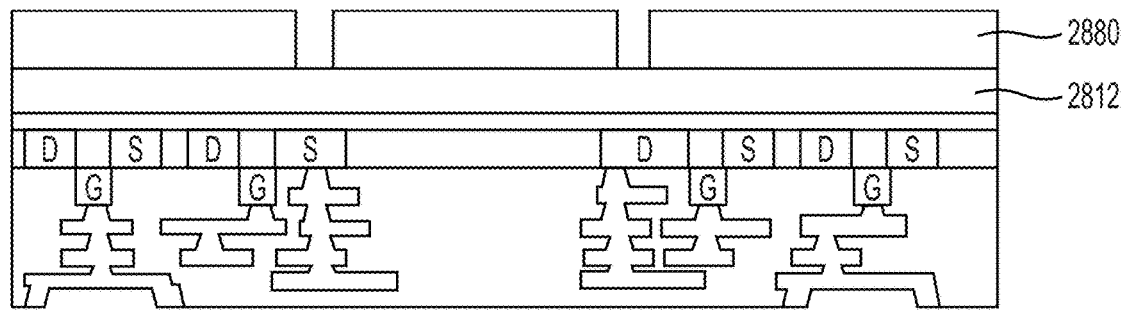
Figure 29:
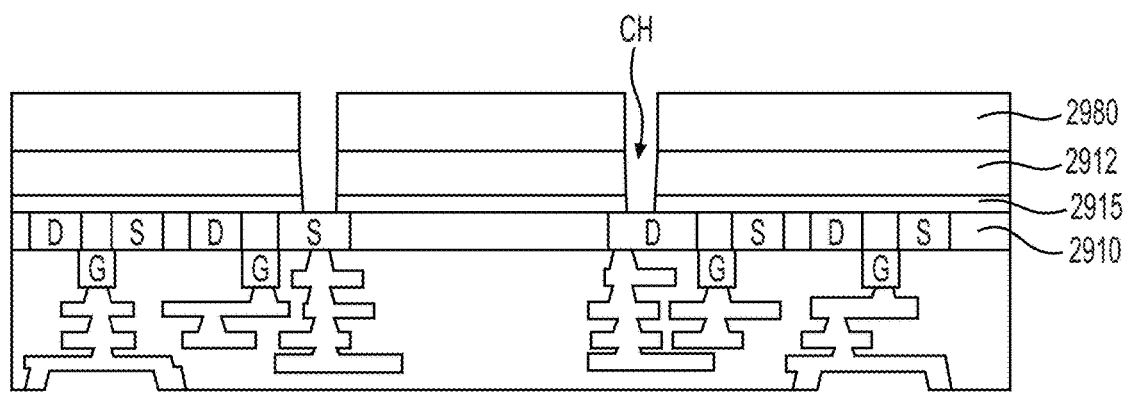

FIG. 27 shows circuitry including the insulating layers 2720 and the metal layers 2740 on the first silicon substrate 2710. The insulating layers 2720 and the metal layers 2740 define an RDL. The silicon layer 2710 can be formed on the RDL using conventional silicon on insulator (SOI) processes. The BOX layer 2715 and the second silicon substrate 2712 can be formed using conventional processes. FIG. 28 shows a patterned resist film 2880 that covers a portion of the second silicon substrate 2812 and that exposes a portion of the second silicon substrate 2812. FIG. 29 shows that the exposed portions of the second silicon substrate 2912 and the BOX layer 2915 under the exposed portions are etched to define a contact hole CH through the second silicon substrate 2912 and BOX layer 2915, exposing portions of the first silicon substrate 2910. The BOX layer 2915 can be used to form the contact hole CH that extends only through the second silicon substrate 2912.

Figure 30:
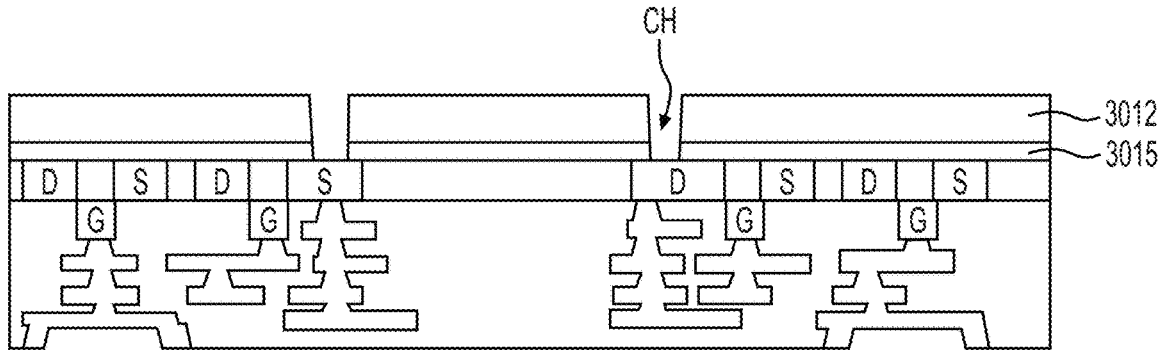
Figure 31:
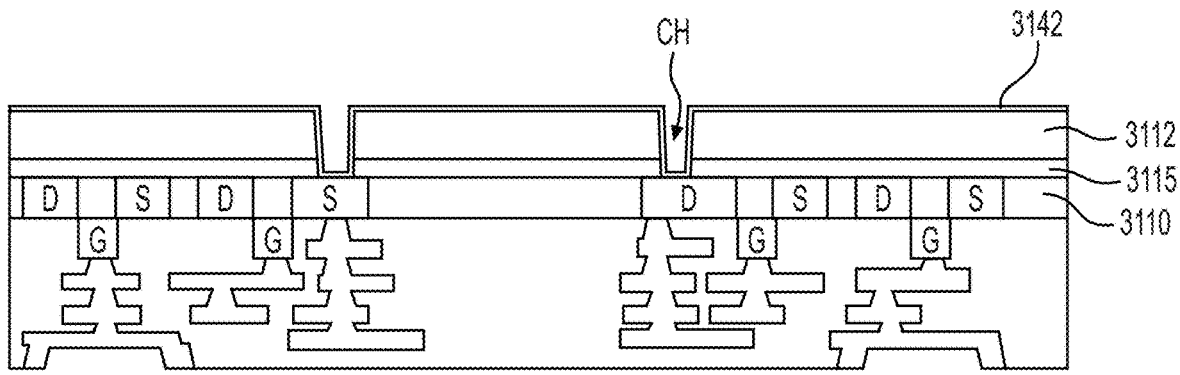
Figure 32:
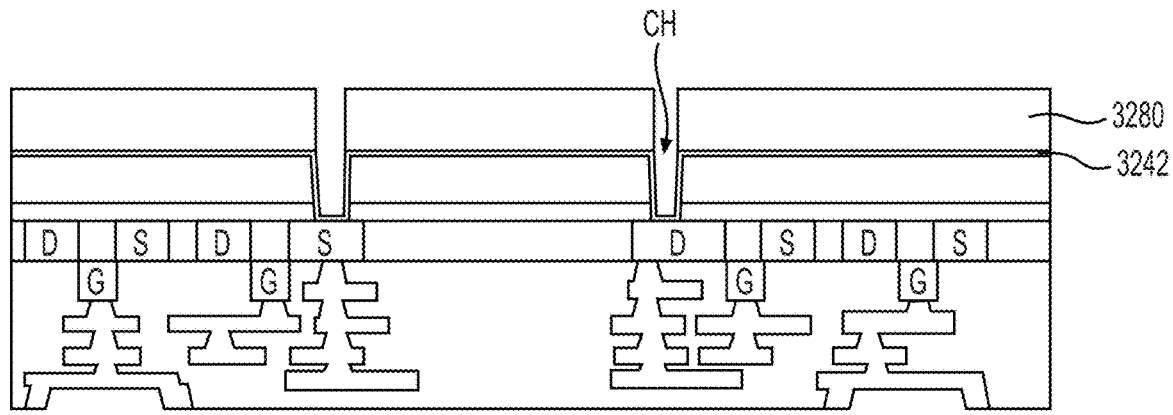

In the step shown by FIG. 30, the resist film is stripped, leaving the contact hole CH in the second silicon substrate 3012 and the BOX layer 3015. FIG. 31 shows a first seed metal 3142 is formed on the second silicon substrate 3112 and in the contact hole CH to contact the BOX layer 3115 and portions of the first silicon substrate 3110. The material used for the seed metal can include those previously described. FIG. 32 shows a patterned resist film 3280 that covers a portion of the first seed metal 3242 and that exposes a portion of the first seed metal 3242 in the contact holes CH.

Figure 33:
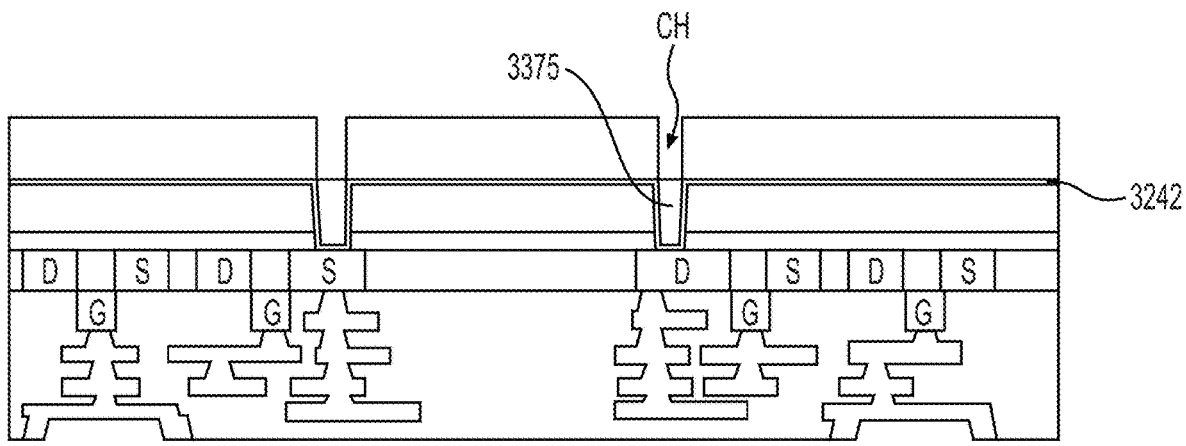
Figure 34:
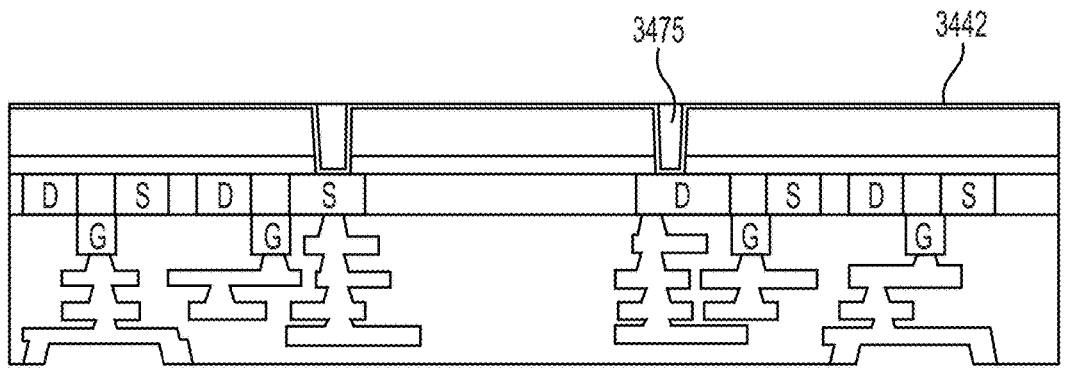
Figure 35:
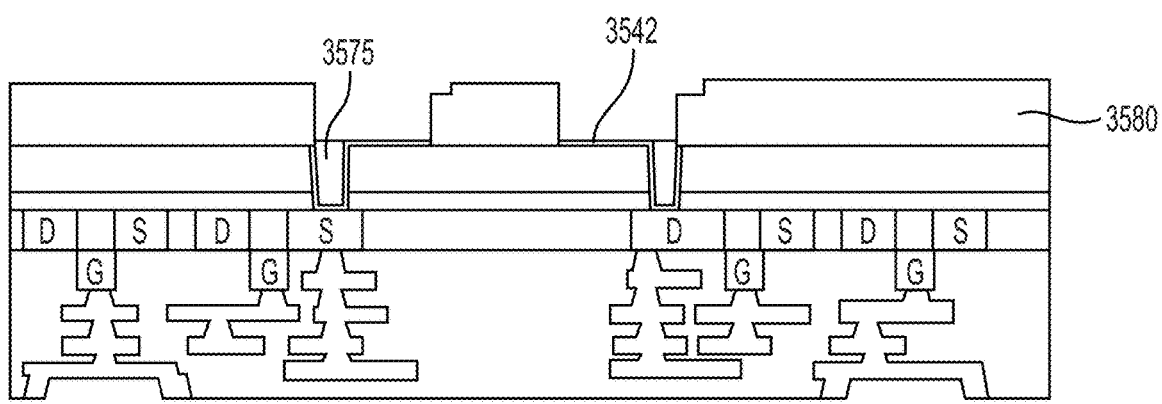

FIG. 33 shows that TSVs 3375 are formed by electrolytically plating copper onto the exposed portions of the first seed metal 3242 in the contact holes CH. In the step shown by FIG. 34, the resist film is stripped to expose the first seed metal 3442 and the TSVs 3475. FIG. 35 shows a patterned resist film 3580 that covers a portion of the first seed metal 3542 and that exposes a portion of the first seed metal 3542 between the TSVs 3575.

Figure 36:
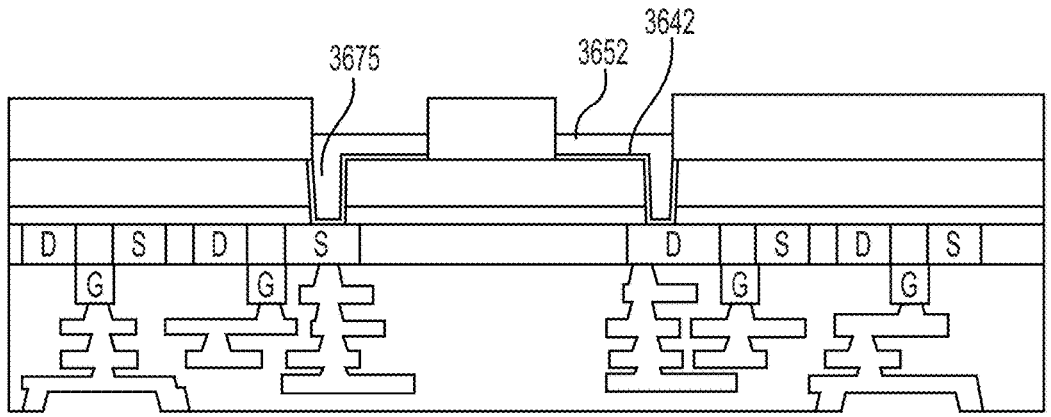
Figure 37:
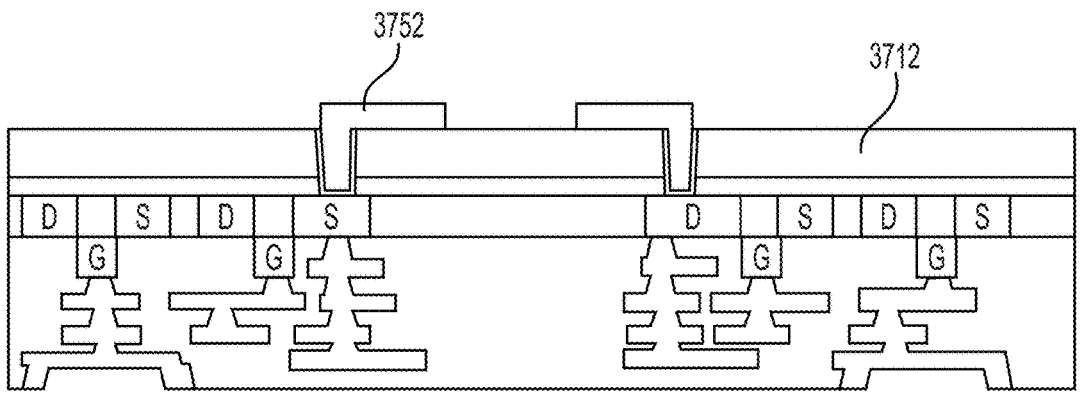
Figure 38:
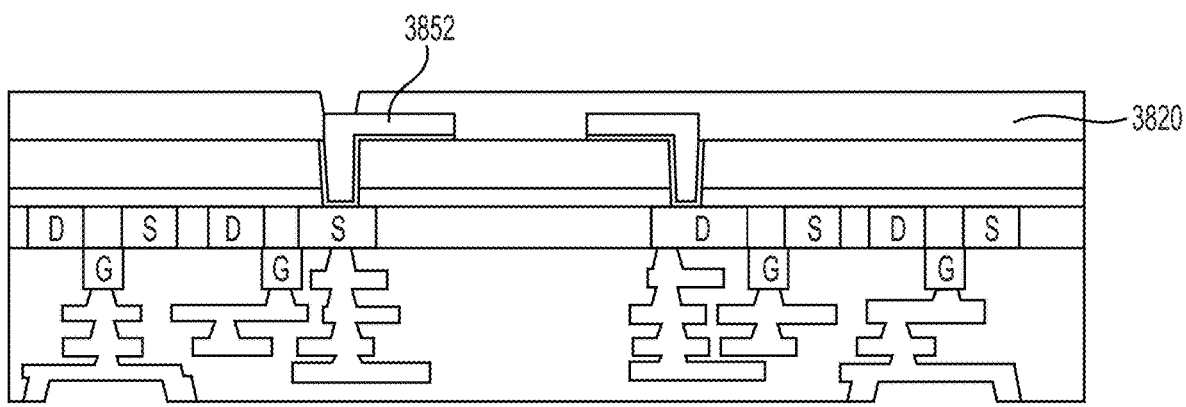

FIG. 36 shows that a bottom winding layer 3652 of the transformer is defined by electrolytically plating copper onto the exposed portion of the first seed metal 3642 and on top of the TSVs 3675. In the step shown by FIG. 37, the resist film is stripped, and the exposed portion of the first seed metal is etched away, leaving the bottom winding layer 3752. The portion of the winding of the transformer or inductor that is defined by the bottom winding layer 3752 and the remaining portion of the first seed metal 3742 is in direct contact with the second silicon substrate 3712. Although FIG. 37 shows a single cross section, it should be understood that multiple, electrically isolated bottom winding layers are formed. The bottom winding layers can be formed in a single step or multiple steps. In a transformer, some of the bottom winding layers define a portion of the primary winding, and some of the bottom winding layers define a portion of the secondary winding. In an inductor, the bottom winding layers define a portion of the inductor winding. FIG. 38 shows that an insulating layer 3820 is formed on and around the bottom winding layer 3852 by heat treatment.

Figure 39:
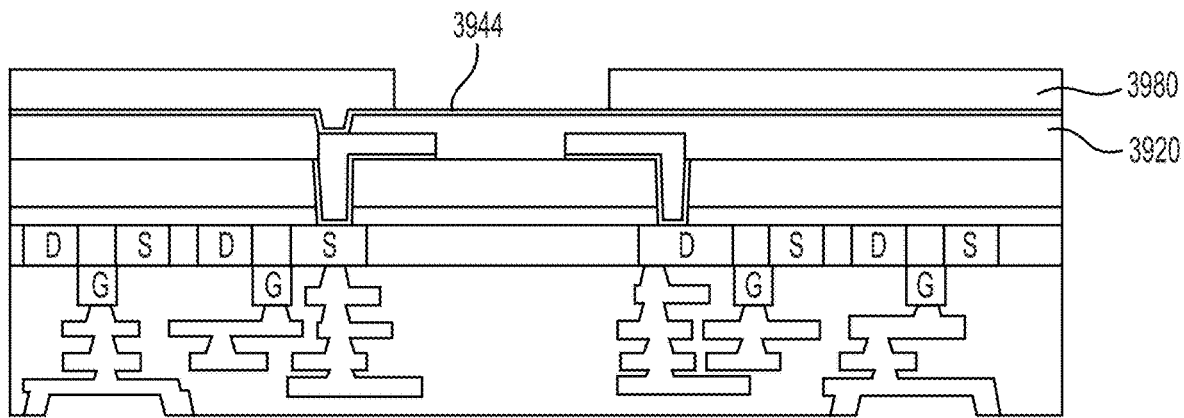
Figure 40:
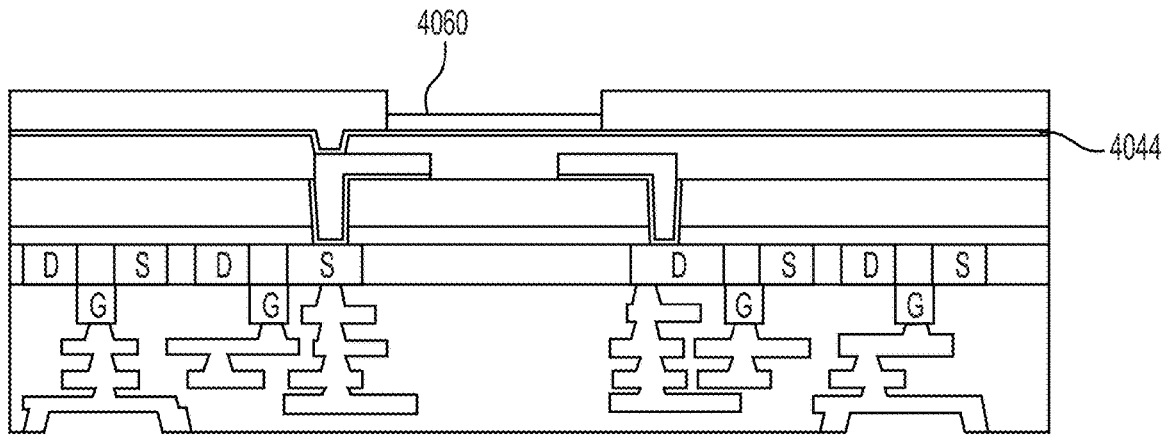
Figure 41:
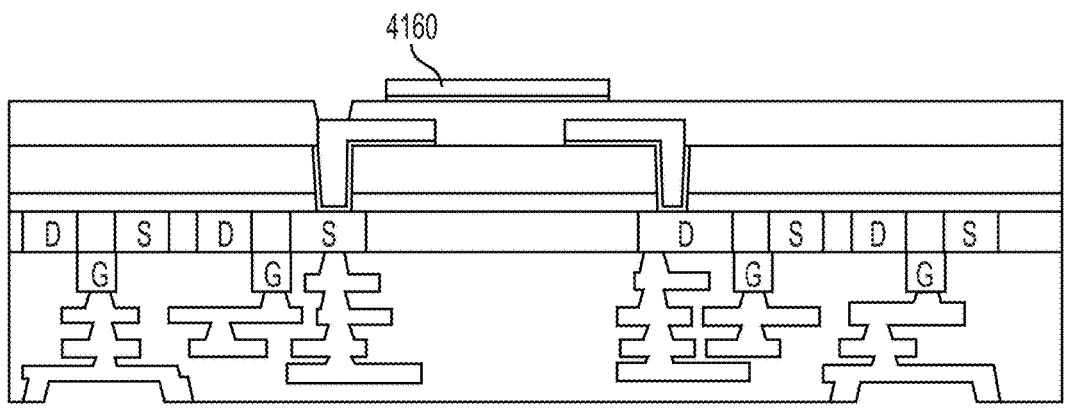

FIG. 39 shows that a second seed metal 3944 is formed on top of the insulating layer 3920, and a patterned resist film 3980 is formed on top of the second seed metal 3944. FIG. 40 shows that a magnetic core 4060 is formed by electroplating the exposed portion of the second seed metal 4044. In the steps shown by FIG. 41, the resist film is stripped exposing the magnetic core 4160, and the exposed portion of the second seed metal is etched away.

Figure 42:
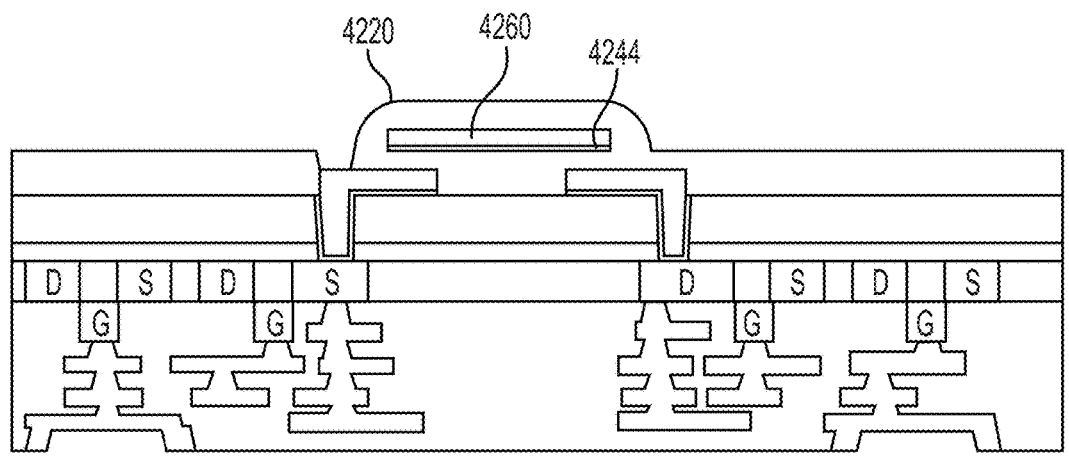
Figure 43:
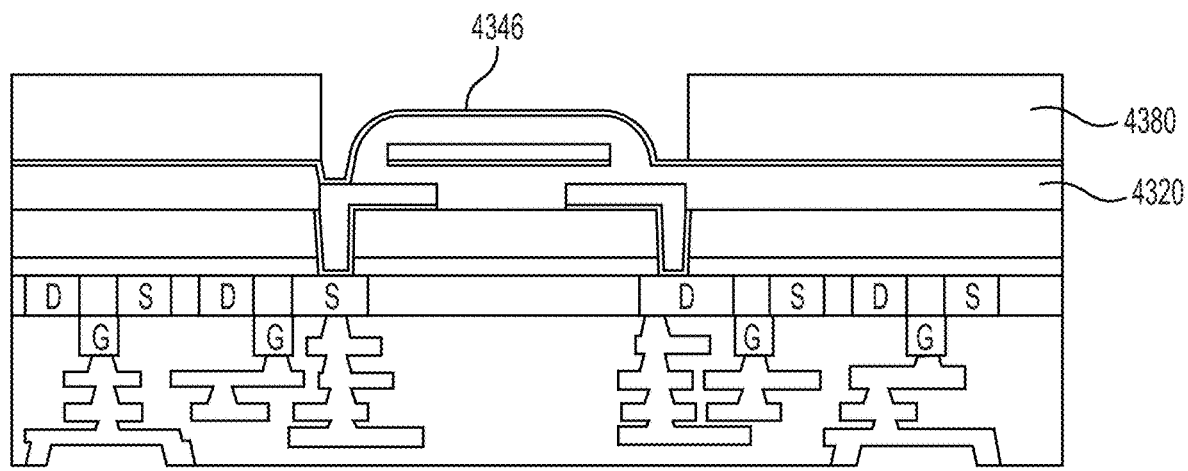

FIG. 42 shows that an insulating layer 4220 is formed on and around the patterned second seed metal 4244 and the magnetic core 4260 using the process previously described with respect to FIG. 68. FIG. 43 shows that a third seed metal 4346 is formed on top of the insulating layer 4320 and that a patterned resist film 4380 is formed on top of the third seed metal 4346, exposing a portion of the third seed metal 4346.

Figure 44:
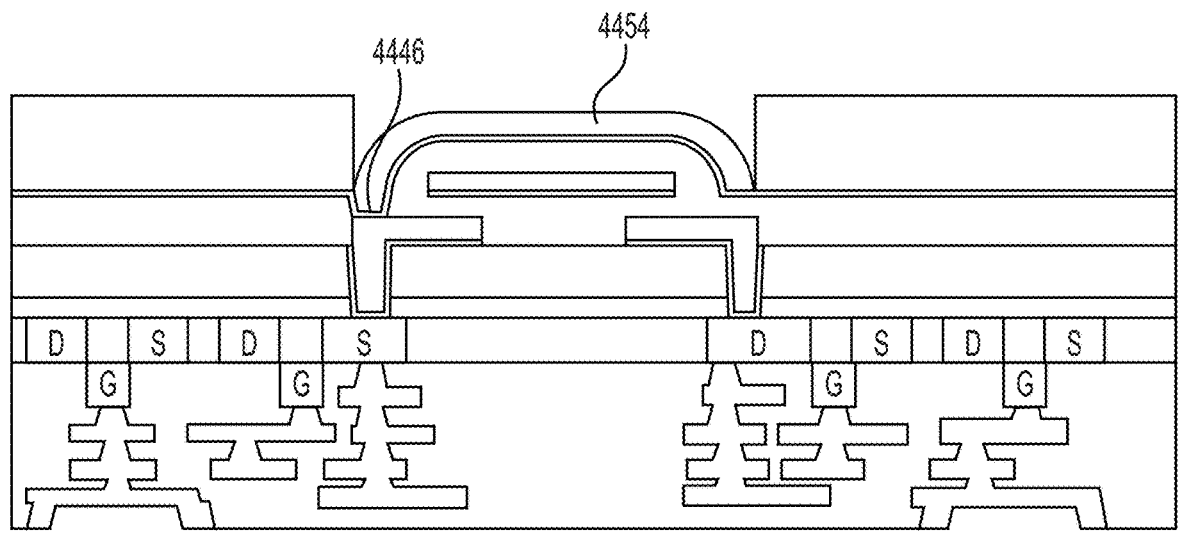
Figure 45:
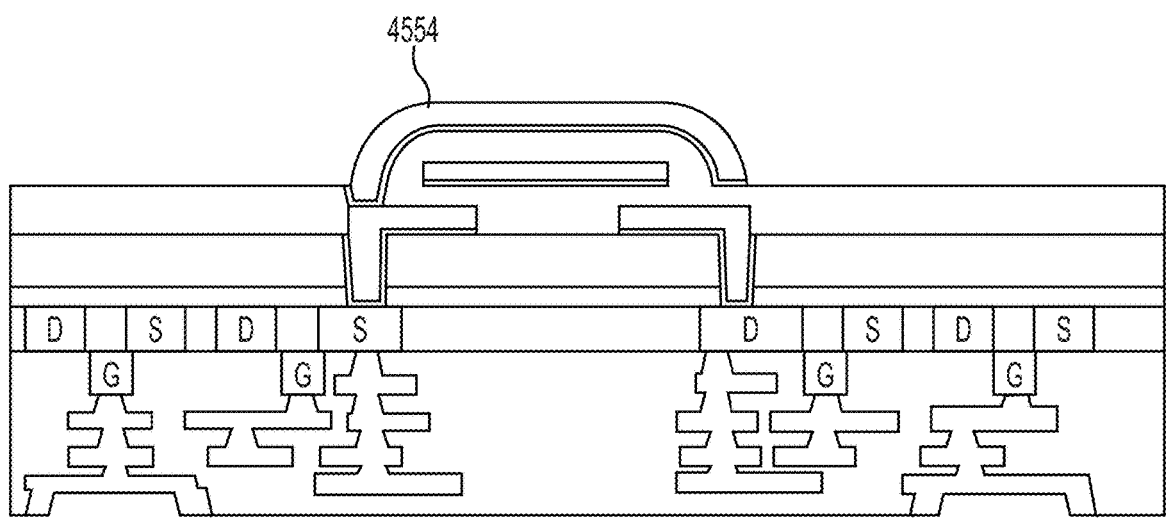

FIG. 44 shows that a top winding layer 4454 of the transformer is formed by electrolytically plating copper onto the exposed portion of the third seed metal 4446. Although FIG. 44 shows a single cross section, it should be understood that the top winding layer 4454 is connected to different bottom winding layers. Multiple top winding layers can be formed in a single step or in multiple steps. In a transformer, some of the top winding layers define a portion of the primary winding, and some of the top winding layers define a portion of the secondary winding. In an inductor, the top winding layers define a portion of the inductor winding. In the step shown by FIG. 45, the resist film is stripped, and the exposed third seed metal is etched, exposing the top winding layer 4554.

Figure 46:
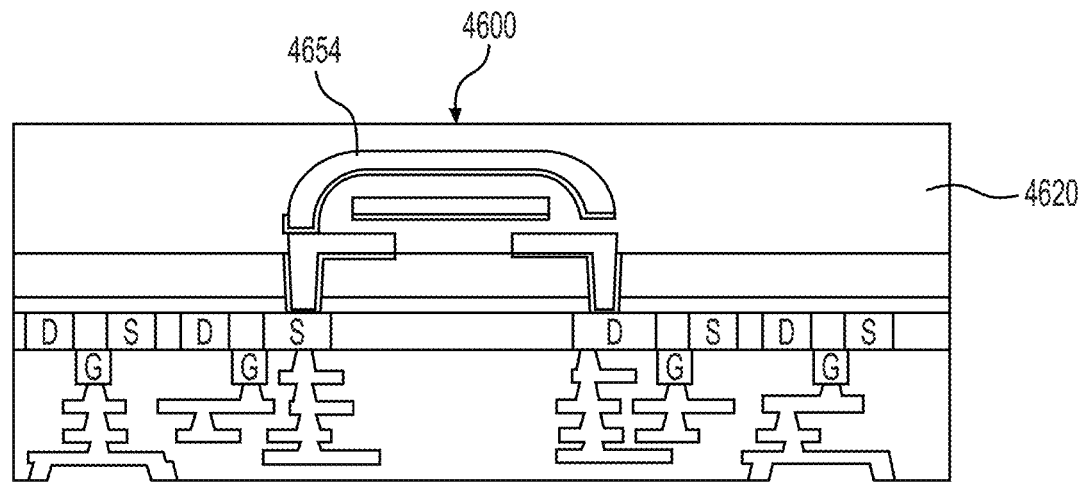

FIG. 46 shows that an insulating layer 4620 is formed on and around the top winding layer 4654 to insulate and to protect the transformer 4600 using the process described with respect to FIG. 68. Although not shown, interconnection pads and solder balls can be formed to interconnect the circuitry to power, control signals, other circuitry, etc. in a manner previously described.

Figure 47:
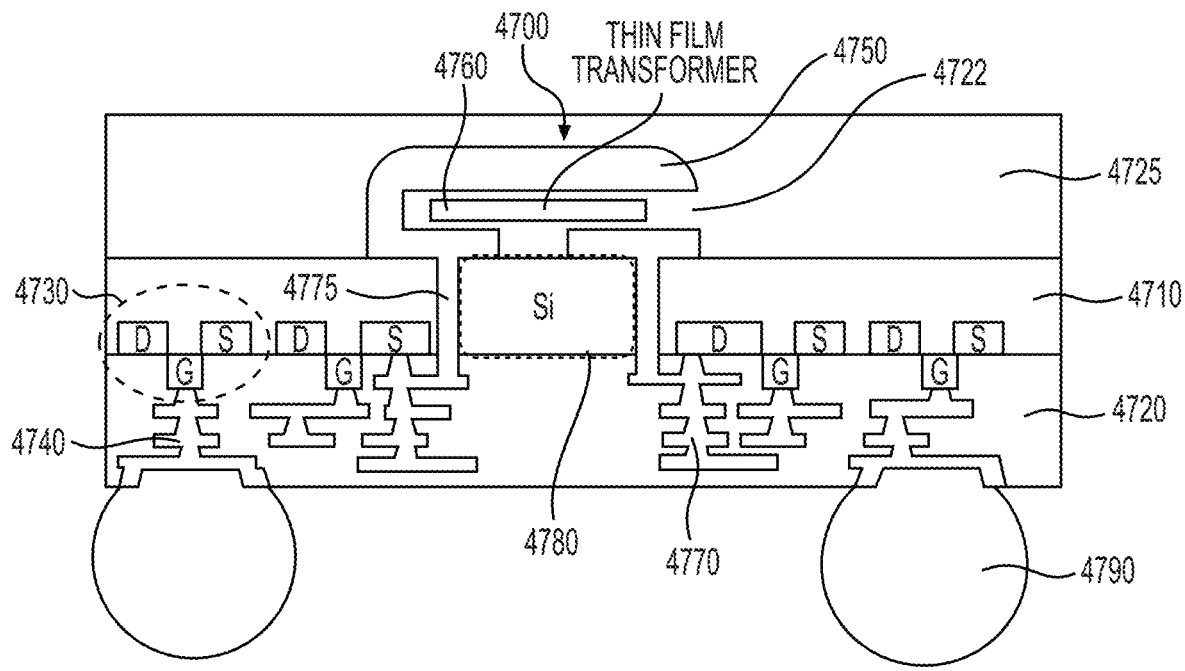
FIG. 47 shows a transformer in a circuit according to another preferred embodiment of the present invention.

FIG. 47 shows a transformer 4700 in a circuit on a silicon substrate 4710 according to another preferred embodiment of the present invention. FIG. 47 is a cross section of a portion of a circuit. Similar to the preferred embodiment shown in FIG. 26, FIG. 47 shows that the silicon substrate 4710 can include doped areas defining sources S and drains D and a metal layer defining gates G of transistors 4730 (within, for example, the dashed oval). The transistors 4730 can be interconnected by metal layers 4740 within insulating material 4720 on the silicon substrate 4710. The metal layers 4740 are formed using typical semiconductor processing techniques. The transformer 4700 includes plated-copper metal windings 4750 that wrap around a core 4760. The metal windings 4750 are connected to the circuit with metal layers 4770. The metal windings 4750 are thicker than the metal layers 4740, with thicknesses as previously described, which allows the metal windings 4750 to transmit higher current. The core 4760 can include any of the materials previously described.

Although FIG. 47 shows a single cross section of the transformer 4700, it should be understood that the metal windings 4750 include both a primary winding connected to the primary circuit and a secondary winding connected to the secondary circuit, where the primary winding and the secondary winding are not physically connected to each other, which provides isolation between the primary and the secondary sides of the transformer 4700. Additionally, portions of the metal windings 4750 can be not connected to adjacent metal layers 4740 where adjacent metal layers 4740 are separated by an isolated point 4722 that is made of an insulating material, which provides isolation between the adjacent metal layers 4740. The cross-section shown in FIG. 47 shows a portion of the metal winding 4750 connected to the primary side of the transformer (i.e., the left side of FIG. 47) and a portion of the metal windings 4750 connected to the secondary side of the transformer (i.e., the right side of FIG. 47). Instead of transformer 4700, it is possible to use an inductor, in which the metal windings 4750 are defined by a single winding.

FIG. 47 shows that a PN junction 4780 (within dotted box) in the silicon substrate 4710 is used to isolate the circuitry between the primary side and the secondary side of the transformer 4700. For example, power transistors on the primary side can be defined by the transistors on the left side of FIG. 47, and synchronous rectifiers on the secondary side can be defined by the transistors on the right side of FIG. 47. Solder balls 4790 can be used to interconnect the integrated circuitry to power, control signals, external circuitry, etc., although other interface features and techniques are also possible.

However, as in the transformer 2600 shown in FIG. 26, the transformer 4700 is formed on the opposite side of the silicon substrate 4710 from the circuitry, connected to the circuitry by TSVs 4775, and covered by an insulating layer 4725. Accordingly, silicon processes can be used in fabricating the transformer circuitry without the extra steps or expense associated with the BOX and the second silicon layers. In this preferred embodiment, the TSVs 4775 connect directly to a metal layer within the circuitry. Although only two TSVs 4775 are shown in FIG. 47, any number of TSVs 4775 can be used. Typically, each winding of the transformer or inductor will include two TSVs. But additional TSVs could be used, if, for example, the winding included a center tap. Because the TSVs 4475 extend all the way through the silicon substrate 4710, a BOX layer is not needed.

FIGS. 48-67 show processing steps included in fabricating the transformer 4700 shown in FIG. 47. A description of features previously described may be omitted for brevity.

Figure 48:
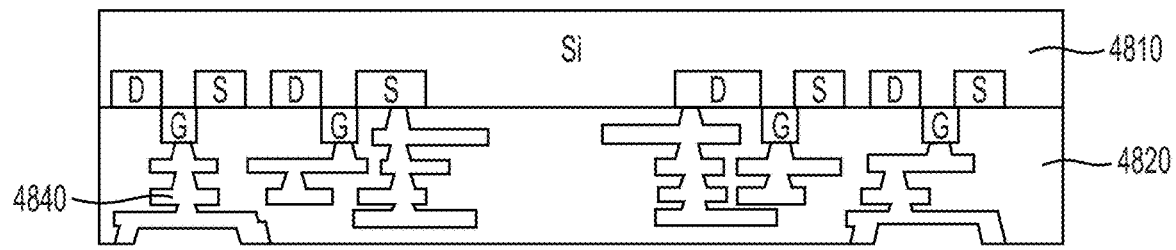
FIGS. 48-67 show processing steps included in fabricating the transformer shown in FIG. 47 according to a preferred process of the present invention.
Figure 49:
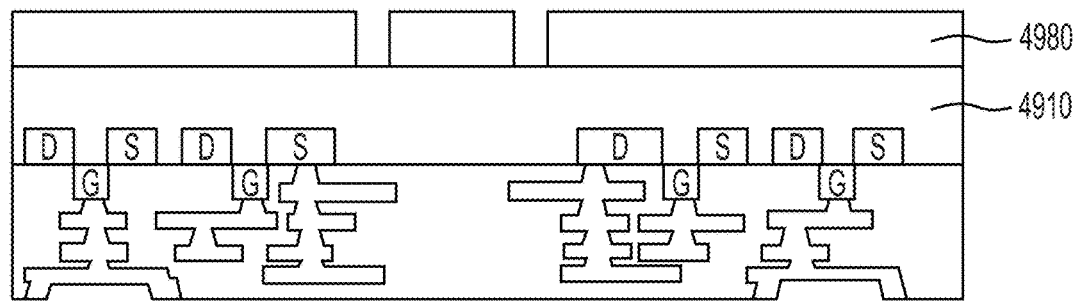
Figure 50:
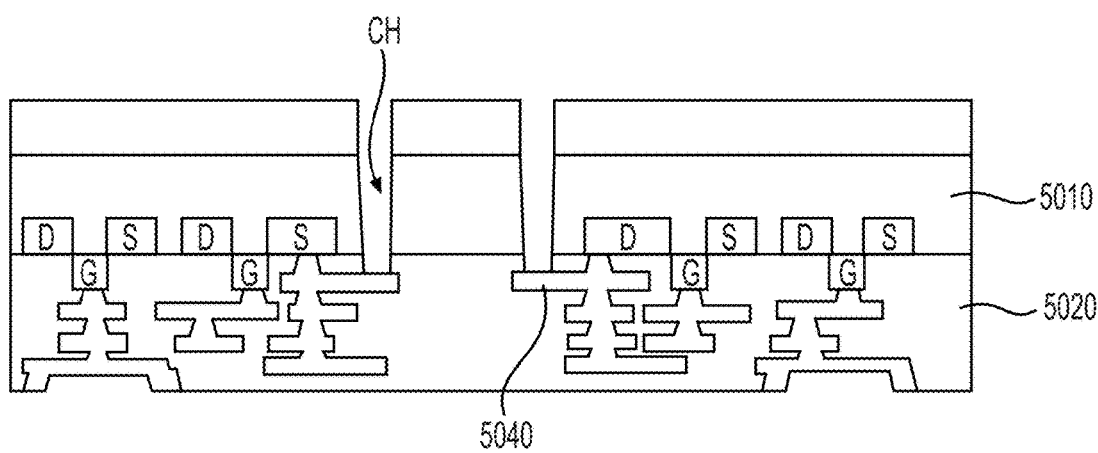

FIG. 48 shows circuitry including the insulating layers 4820 and the metal layers 4840 on the first silicon substrate 4810. The insulating layers 4820 and the metal layers 4840 define an RDL. The silicon layer 4810 can be formed on the RDL using conventional silicon on insulator (SOI) processes. FIG. 49 shows a patterned resist film 4980 that covers a portion of the silicon substrate 4910 and that exposes portions of the silicon substrate 4910. FIG. 50 shows that the exposed portions of the silicon substrate 5010 and portions of the insulating layers 5020 that are under the exposed portions of the silicon substrate 5010 are etched to expose a metal layer 5040 and to define contact holes CH through the silicon substrate 5010 and the insulating layers 5020.

Figure 51:
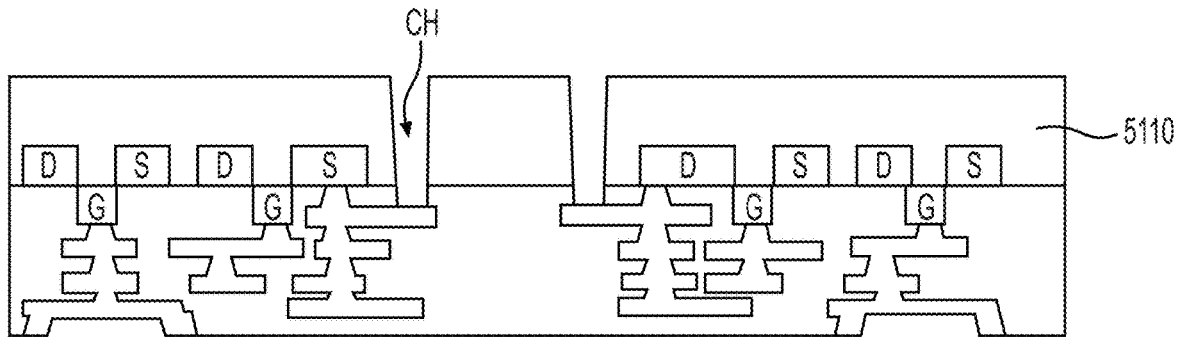
Figure 52:
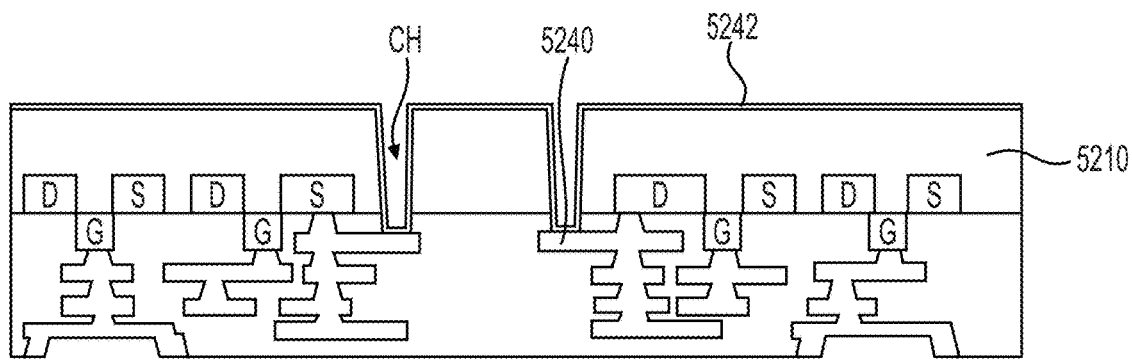
Figure 53:
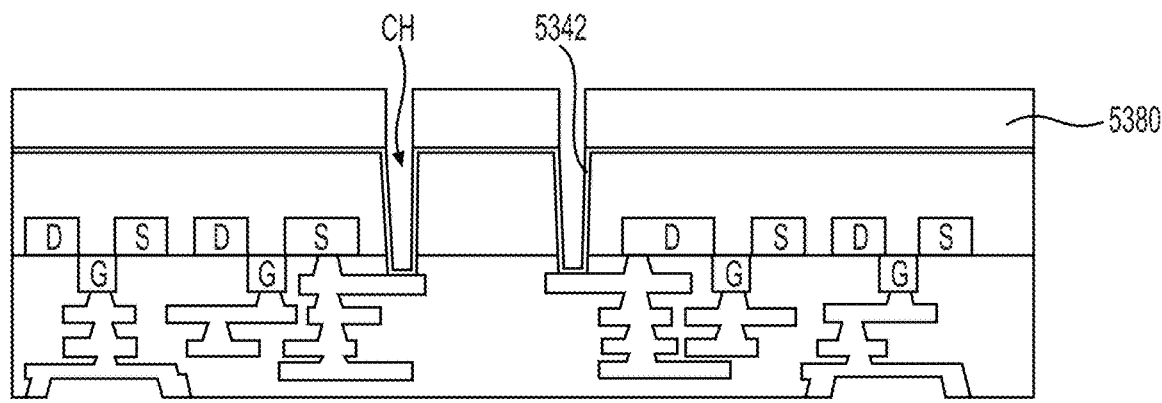

In the step shown by FIG. 51, the resist film is stripped, leaving contact holes CH in the silicon substrate 5110. FIG. 52 shows a first seed metal 5242 is formed on the silicon substrate 5210 and in the contact holes CH to contact the metal layer 5240. FIG. 53 shows a patterned resist film 5380 is formed to cover a portion of the first seed metal 5342 and to expose a portion of the first seed metal 5342 in the contact holes CH.

Figure 54:
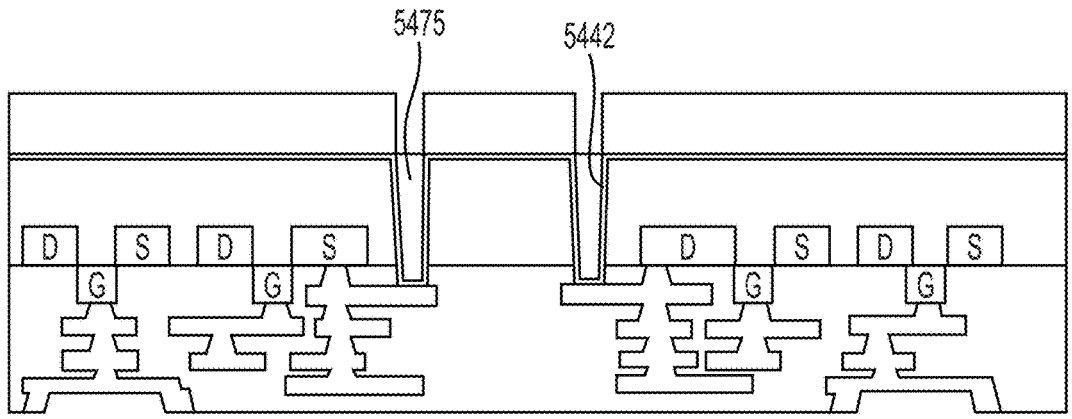
Figure 55:
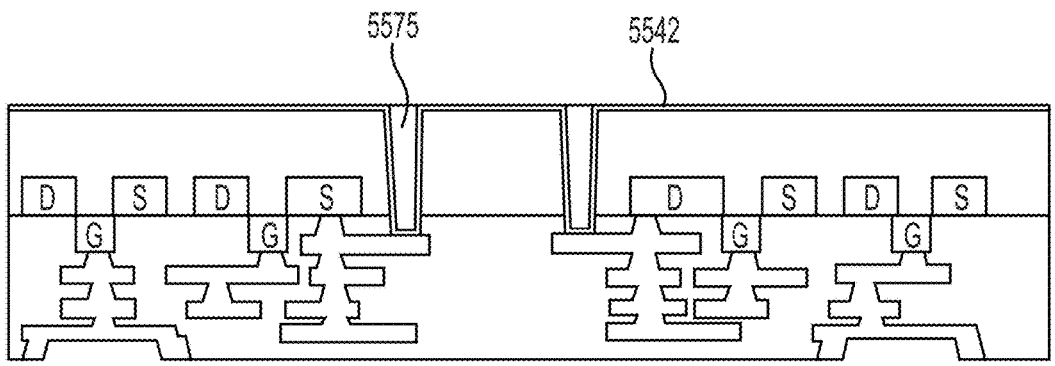
Figure 56:
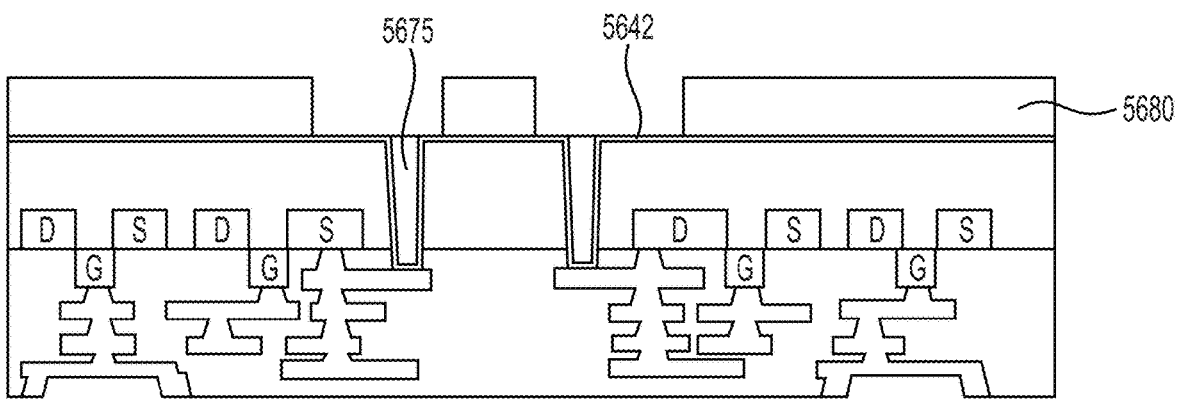

FIG. 54 shows that TSVs 5475 can be formed by electrolytically plating copper onto the exposed portion of the first seed metal 5442 in the contact holes CH. In the step shown by FIG. 55, the resist film is stripped, exposing the first seed metal 5542 and the TSVs 5575. FIG. 56 shows a patterned resist film 5680 is formed to cover a portion of the first seed metal 5642 and to expose a portion of the first seed metal 5642 in a region around the TSVs 5675.

Figure 57:
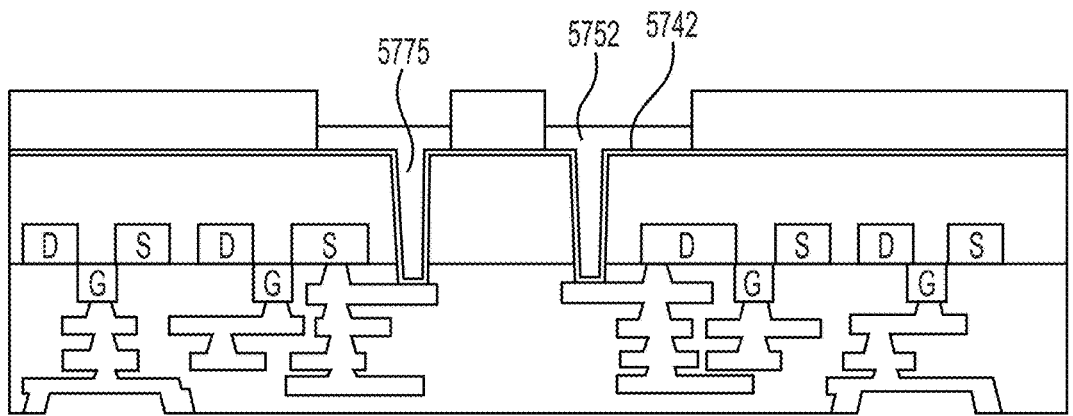
Figure 58:
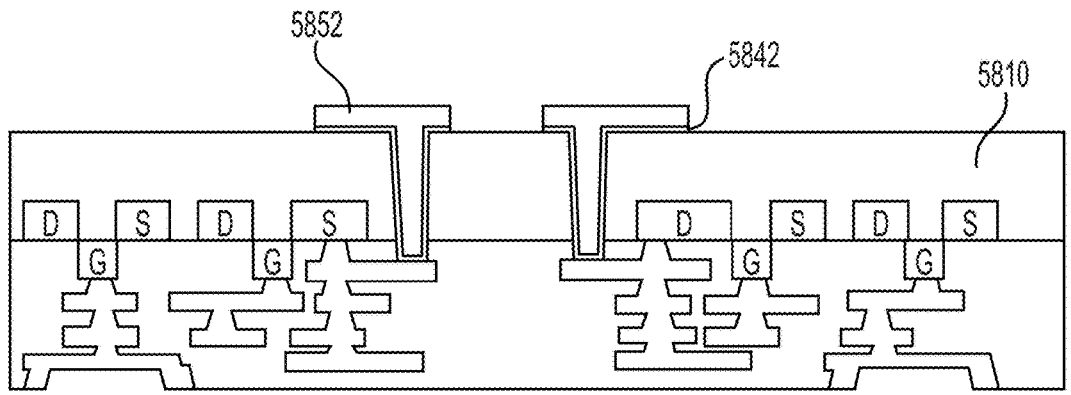
Figure 59:
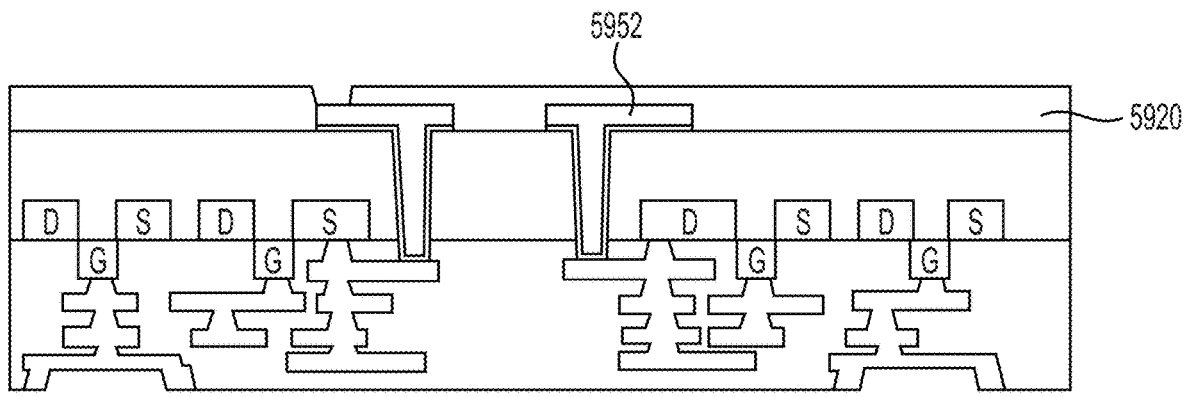

FIG. 57 shows that a bottom winding layer 5752 of the transformer is formed by electrolytically plating copper onto the exposed portions of the first seed metal 5742 and TSVs 5775. In the step shown by FIG. 58, the resist film is stripped, and the exposed portion of the first seed metal is etched away leaving the bottom winding layer 5852. The portion of the winding of the transformer or inductor that is defined by the bottom winding layer 5852 and the remaining portion of the first seed metal 5842 is in direct contact with the silicon substrate 5810. Although FIG. 58 shows a single cross section, it should be understood that multiple, electrically isolated bottom winding layers are formed. The bottom winding layers can be formed in a single step or multiple steps. In a transformer, some of the bottom winding layers define a portion of the primary winding, and some of the bottom winding layers define a portion of the secondary winding. In an inductor, the bottom winding layers define a portion of the inductor winding. FIG. 59 shows that an insulating layer 5920 is formed on and around the bottom winding layer 5952 using the process previously described with respect to FIG. 68 to expose portions of the bottom winding layer 5952.

Figure 60:
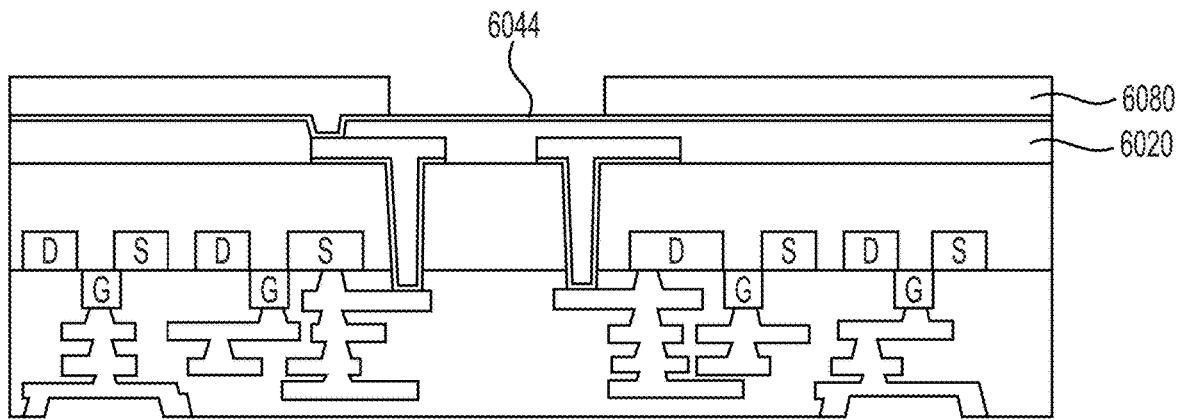
Figure 61:
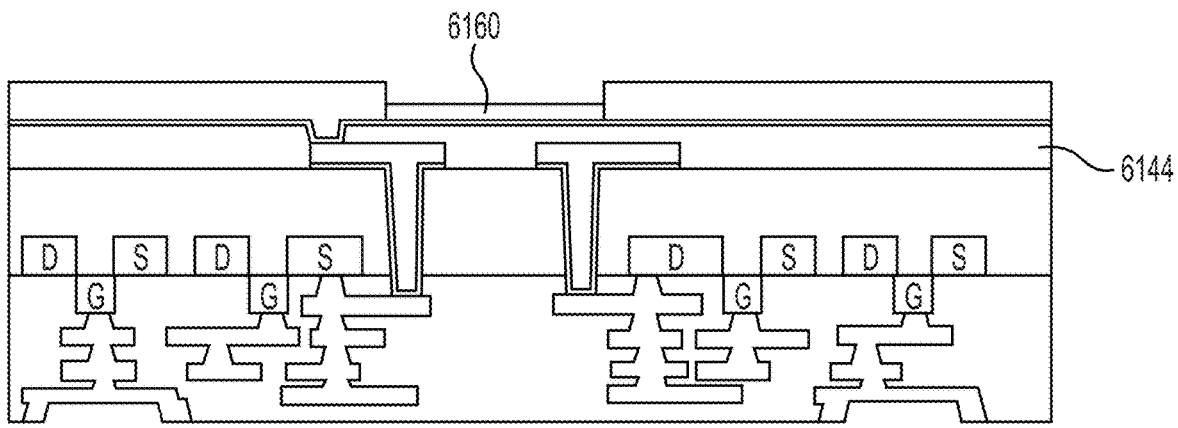
Figure 62:
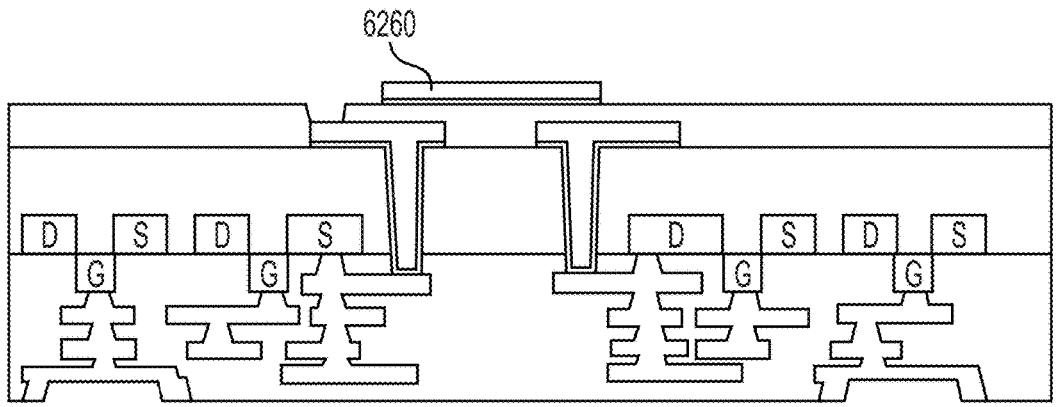

FIG. 60 shows that a second seed metal 6044 is formed on top of the insulating layer 6020, and a patterned resist film 6080 is formed on top of the second seed metal 6044. FIG. 61 shows that a magnetic core 6160 is formed by electroplating any of the materials previously described on the exposed portion of the second seed metal 6144. In the steps shown by FIG. 62, the resist film is stripped, exposing the magnetic core 6260, and the exposed second seed metal is etched away.

Figure 63:
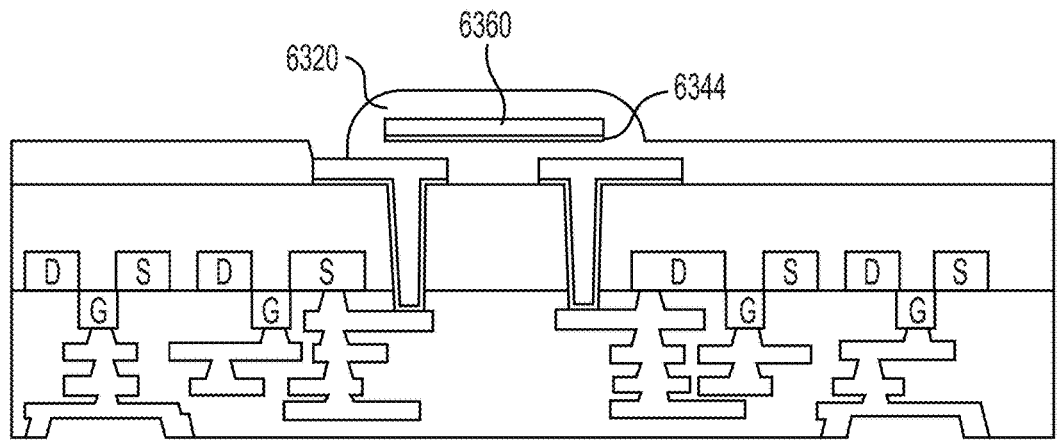
Figure 64:
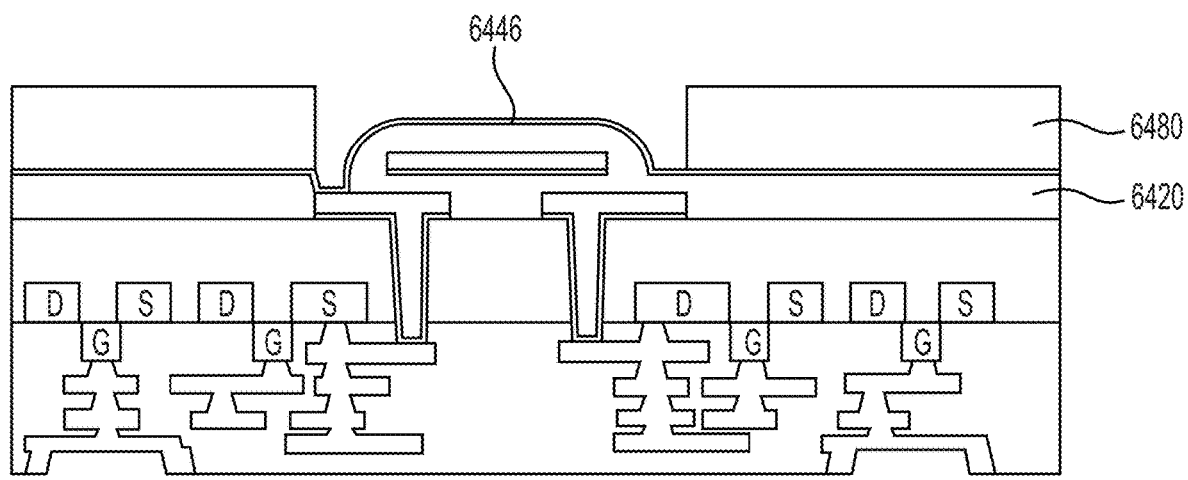

FIG. 63 shows that an insulating layer 6320 is formed on and around the patterned second seed metal 6344 and the magnetic core 6360 using the process previously described with respect to FIG. 68. FIG. 64 shows that a third seed metal 6446 is formed on top of the insulating layer 6420 and that a patterned resist film 6480 is formed on top of the third seed metal 6446, exposing a portion of the third seed metal 6446.

Figure 65:
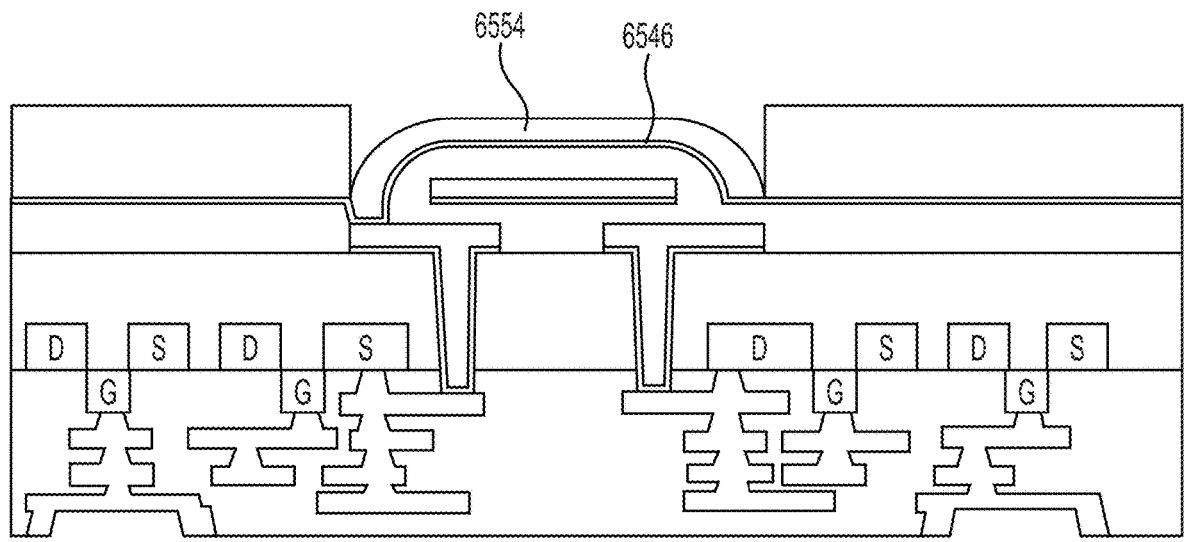
Figure 66:
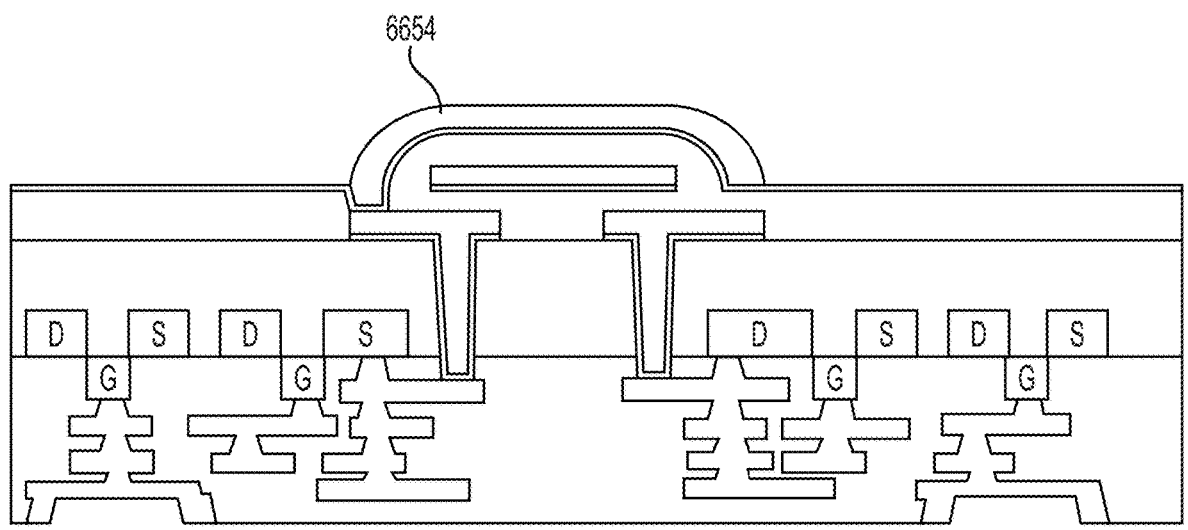

FIG. 65 shows that a top winding layer 6554 of the transformer is formed by electrolytically plating copper onto the exposed portion of the third seed metal 6546. Although FIG. 65 shows a single cross section, it should be understood that the top winding layer 6554 is connected to different bottom winding layers. Multiple top winding layers can be formed in a single step or in multiple steps. In a transformer, some of the top winding layers define a portion of the primary winding, and some of the top winding layers define a portion of the secondary winding. In an inductor, the top winding layers define a portion of the inductor winding. In the step shown by FIG. 66, the resist film is stripped, and the exposed third seed metal is etched, exposing the top winding layer 6654.

Figure 67:
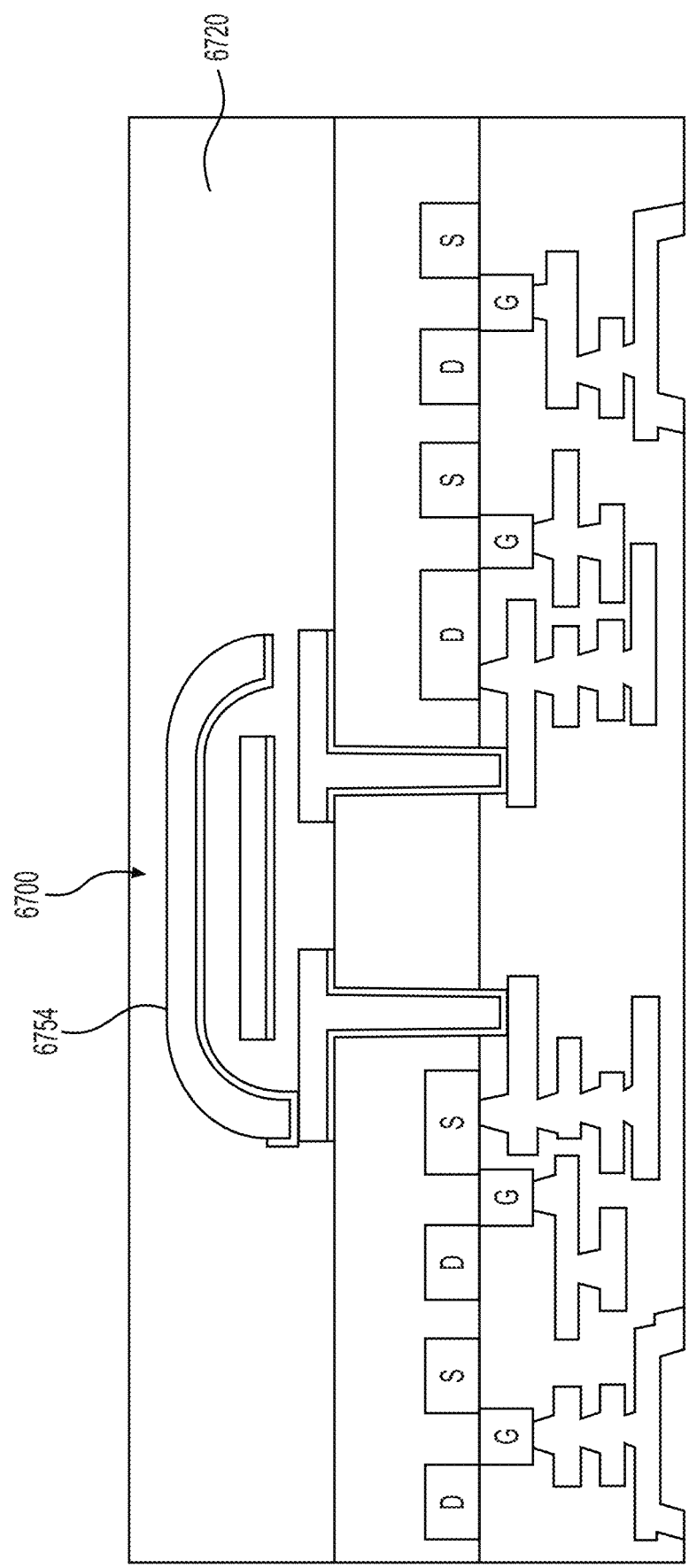

FIG. 67 shows that an insulating layer 6720 is formed around the top winding layer 6754 to insulate and to protect the transformer 6700 using the process previously described with respect to FIG. 68. Although not shown, interconnection pads and solder balls can be formed to interconnect the circuitry on the substrate side opposite to the transformer 6700.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. An electronic component comprising:
a redistribution layer including a metal layer and an insulating layer;
a silicon substrate including a first transistor and a second transistor; and
a magnetic component that includes a first metal winding that extends around a core and that is connected to the metal layer; wherein
the first metal winding is thicker than the metal layer.

2. The electronic component of claim 1, further comprising a PN junction between the first transistor and the second transistor.

3. The electronic component of claim 1, further comprising a through-silicon via that extends through at least a portion of the silicon substrate and that connects the metal layer and the first metal winding.

4. The electronic component of claim 1, wherein a portion of the first metal winding is in direct contact with the silicon substrate.

5. The electronic component of claim 1, wherein the redistribution layer and the magnetic component are on opposite sides of the silicon substrate.

6. The electronic component of claim 1, wherein the redistribution layer and the magnetic component are on a same side of the silicon substrate.

7. The electronic component of claim 1, wherein
the magnetic component is a transformer and further includes a second metal winding; and
the second metal winding extends around the core and is not electrically connected to the first metal winding.

8. The electronic component of claim 7, wherein
the first transistor is connected to the first metal winding; and
the second transistor is connected to the second metal winding.

9. The electronic component of claim 7, wherein the first metal winding and the second metal winding are electrically isolated from each other.

10. The electronic component of claim 7, wherein the second metal winding is thicker than the metal layer.

11. The electronic component of claim 7, wherein the second metal winding includes an electroplated copper layer.

12. The electronic component of claim 1, wherein the magnetic component is an inductor.

13. The electronic component of claim 1, wherein the first metal winding includes an electroplated copper layer.

14. A transformer comprising:
a silicon substrate; and
an insulating layer that is on the silicon substrate and that includes:
a plurality of metal layers;
a core;
a bottom winding of a metal that extends below the core and that contacts a first metal layer and a second metal layer of the plurality of metal layers; and
a top winding of the metal that extends around the core; wherein
at least one of the top winding and the bottom winding is thicker than each of the plurality of metal layers.

15. The transformer according to claim 14, further comprising circuitry on the silicon substrate; wherein
the bottom winding, the top winding, and the core are on a same side of the silicon substrate as the circuitry.

16. The transformer according to claim 14, further comprising a PN junction in the silicon substrate that isolates a primary side and a secondary side of the transformer.

17. The transformer according to claim 14, wherein the bottom winding and the top winding include an electroplated copper layer.

18. The transformer according to claim 14, wherein
the top winding and the bottom winding define a primary winding and a secondary winding; and
the primary winding and the secondary winding are connected to respective metal layers of the plurality of metal layers and are not electrically connected to each other.

19. The transformer according to claim 14, wherein the metal is copper.

20. A transformer comprising:
a silicon substrate;
circuitry that is located on a first side of the silicon substrate and that includes a plurality of metal layers; and
an insulating layer that is located on a second side of the silicon substrate and that includes:

a core;
a bottom winding of a metal that extends below the core and that contacts the circuitry through the silicon substrate; and
a top winding of the metal that extends around the core and that contacts the circuitry through the silicon substrate; wherein
at least one of the top winding and the bottom winding is thicker than each of the plurality of metal layers.

21. The transformer according to claim 20, further comprising a PN junction in the silicon substrate isolating a primary side from a secondary side of the transformer.

22. The transformer according to claim 20, wherein the bottom winding and the top winding include an electroplated copper layer.

23. The transformer according to claim 20, wherein
the top winding and the bottom winding define a primary winding and a secondary winding; and
the primary winding and the secondary winding are connected to respective metal layers of the plurality of metal layers and are not electrically connected to each other.

24. The transformer according to claim 20, wherein the metal is copper.

25. The transformer according to claim 20, wherein
the silicon substrate includes an oxide layer;
the bottom winding is connected to the circuitry through the silicon substrate and the oxide layer; and
the top winding is connected to the circuitry through the silicon substrate and the oxide layer.

* * * * *